(12) United States Patent
Farnworth et al.

(10) Patent No.: US 6,708,399 B2
(45) Date of Patent: Mar. 23, 2004

(54) METHOD FOR FABRICATING A TEST INTERCONNECT FOR BUMPED SEMICONDUCTOR COMPONENTS

(75) Inventors: Warren M. Farnworth, Nampa, ID (US); Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 327 days.

(21) Appl. No.: 09/834,805

(22) Filed: Apr. 12, 2001

(65) Prior Publication Data

US 2001/0011907 A1 Aug. 9, 2001

Related U.S. Application Data

(62) Division of application No. 09/275,791, filed on Mar. 25, 1999, now Pat. No. 6,437,591.

(51) Int. Cl.[7] .............................. H05K 3/36; G01R 31/26
(52) U.S. Cl. ............................ 29/830; 29/847; 29/852; 29/846; 324/757; 324/765
(58) Field of Search ....................... 29/830, 832, 840, 29/847, 843, 852; 324/757, 765, 754; 439/70, 84

(56) References Cited

U.S. PATENT DOCUMENTS

| | | |
|---|---|---|
| 4,937,653 A | 6/1990 | Blonder et al. |
| 5,006,792 A | 4/1991 | Malhi et al. |
| 5,046,239 A | 9/1991 | Miller et al. |
| 5,073,117 A | 12/1991 | Malhi et al. |
| 5,137,461 A | 8/1992 | Bindra et al. |
| 5,172,050 A | 12/1992 | Swapp |
| 5,196,726 A | 3/1993 | Nishiguchi et al. |
| 5,329,423 A | 7/1994 | Scholz |
| 5,341,564 A | 8/1994 | Akhavain et al. |
| 5,419,807 A | 5/1995 | Akram et al. |
| 5,420,520 A | 5/1995 | Anschel et al. |
| 5,478,779 A | 12/1995 | Akram |
| 5,481,205 A | 1/1996 | Frye et al. |
| 5,483,741 A | 1/1996 | Akram et al. |
| 5,500,605 A | 3/1996 | Chang |
| 5,519,332 A | 5/1996 | Wood et al. |
| 5,539,324 A | 7/1996 | Wood et al. |
| 5,541,525 A | 7/1996 | Wood et al. |
| 5,559,444 A | 9/1996 | Farnworth et al. |

(List continued on next page.)

FOREIGN PATENT DOCUMENTS

| | | |
|---|---|---|
| JP | 8-50146 | 2/1996 |
| JP | 10-79362 | 3/1998 |
| JP | 2000-31185 | 1/2000 |

OTHER PUBLICATIONS

Information displayed at Chip Con 1997–1998, 4 sheets, on GE CRD Floating Point Technology.

*Primary Examiner*—Carl J. Arbes
*Assistant Examiner*—Minh Trinh
(74) *Attorney, Agent, or Firm*—Stephen A. Gratton

(57) ABSTRACT

A method for fabricating an interconnect for testing semiconductor components forms contacts on a substrate configured to support and electrically engage bumped contacts on the components. Each contact includes a support member suspended on the substrate on cantilevered spring segment leads. The method includes the steps of forming a polymer material on the substrate, forming a metal layer on the polymer material and the substrate, forming the support member and leads in the metal layer, and then removing the polymer material to suspend the support member. In a first embodiment the polymer material fills a recess in the substrate and the support member is suspended on the recess. In a second embodiment the polymer material is formed as a bump, and the support member is suspended on a surface of the substrate.

20 Claims, 12 Drawing Sheets

U.S. PATENT DOCUMENTS

| | | |
|---|---|---|
| 5,578,526 A | 11/1996 | Akram et al. |
| 5,592,736 A * | 1/1997 | Akram et al. .................. 29/842 |
| 5,625,298 A | 4/1997 | Hirano et al. |
| 5,629,837 A | 5/1997 | Barabi et al. |
| 5,663,654 A | 9/1997 | Wood et al. |
| 5,686,317 A | 11/1997 | Akram et al. |
| 5,691,041 A | 11/1997 | Frankeny et al. |
| 5,783,461 A | 7/1998 | Hembree |
| 5,796,264 A | 8/1998 | Farnworth et al. |
| 5,802,699 A | 9/1998 | Fjelstad et al. |
| 5,810,609 A | 9/1998 | Faraci et al. |
| 5,815,000 A | 9/1998 | Farnworth et al. |
| 5,834,945 A | 11/1998 | Akram et al. |
| 5,878,485 A | 3/1999 | Wood et al. |
| 5,900,674 A | 5/1999 | Wojnarowski et al. |
| 5,931,685 A | 8/1999 | Hembree et al. |
| 5,962,921 A | 10/1999 | Farnworth et al. |
| 5,973,394 A | 10/1999 | Slocum et al. |
| 6,016,060 A | 1/2000 | Akram et al. |
| 6,040,702 A | 3/2000 | Hembree et al. |
| 6,072,326 A | 6/2000 | Akram et al. |
| 6,086,386 A | 7/2000 | Fjelstad et al. |
| 6,091,252 A | 7/2000 | Akram et al. |
| 6,107,109 A | 8/2000 | Akram et al. |
| 6,188,301 B1 | 2/2001 | Kornrumpf et al. |
| 6,200,143 B1 | 3/2001 | Haba et al. |
| 6,208,156 B1 | 3/2001 | Hembree |
| 6,208,157 B1 | 3/2001 | Akram et al. |
| 6,222,280 B1 | 4/2001 | Farnworth et al. |
| 6,232,243 B1 | 5/2001 | Farnworth et al. |
| 6,242,932 B1 | 6/2001 | Hembree |
| 6,294,837 B1 | 9/2001 | Akram et al. |
| 6,310,484 B1 | 10/2001 | Akram et al. |
| 6,313,651 B1 | 11/2001 | Hembree et al. |
| 6,314,641 B1 | 11/2001 | Akram |
| 6,329,829 B1 | 12/2001 | Farnworth et al. |
| 6,333,555 B1 | 12/2001 | Farnworth et al. |
| 6,337,577 B1 | 1/2002 | Doherty et al. |
| 6,437,451 B2 | 8/2002 | Farnworth et al. |
| 6,437,591 B1 * | 8/2002 | Farnworth et al. .......... 324/765 |
| 6,517,362 B2 | 2/2003 | Hirai et al. |
| 6,529,026 B1 * | 3/2003 | Farnworth et al. .......... 324/757 |

* cited by examiner

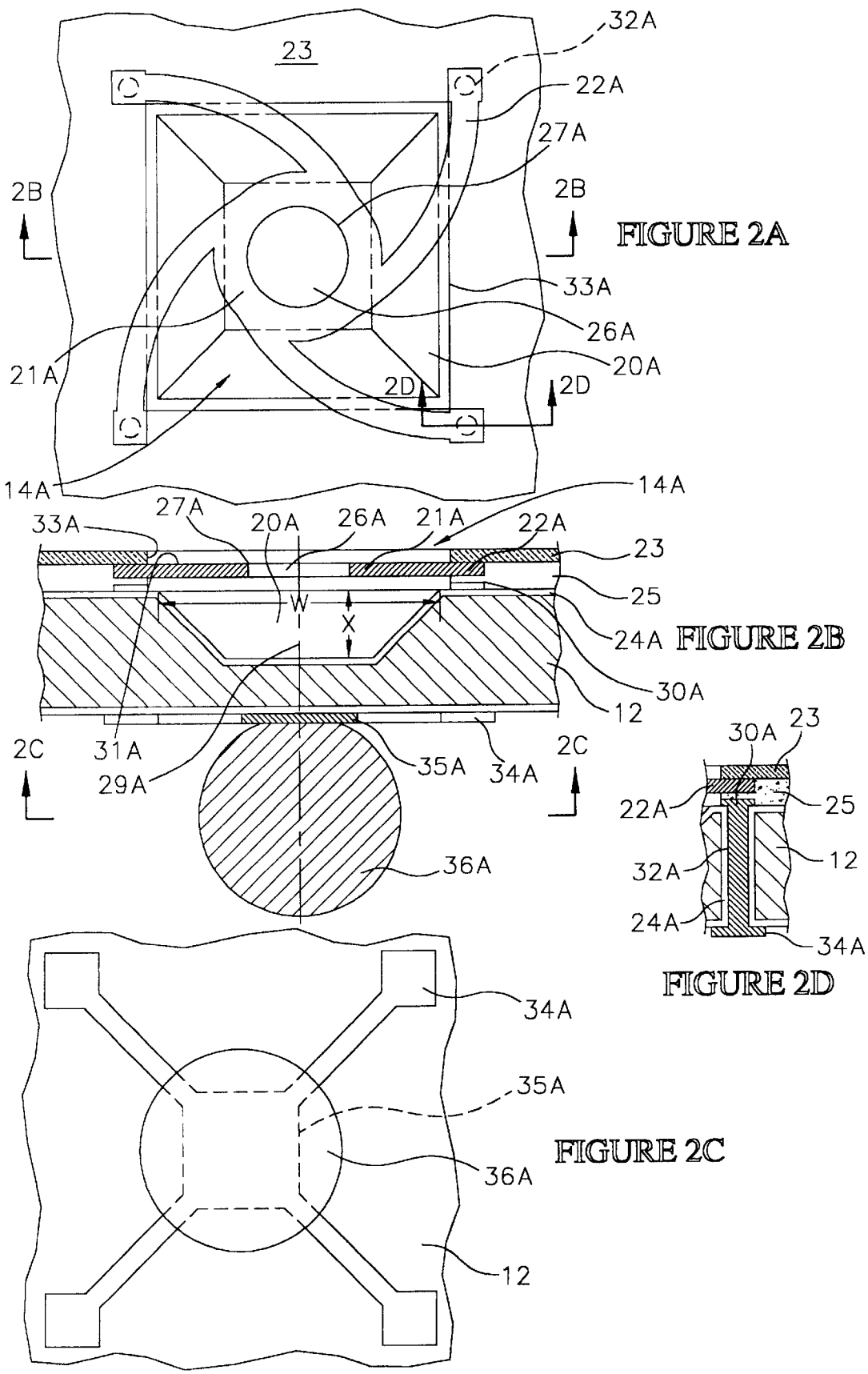

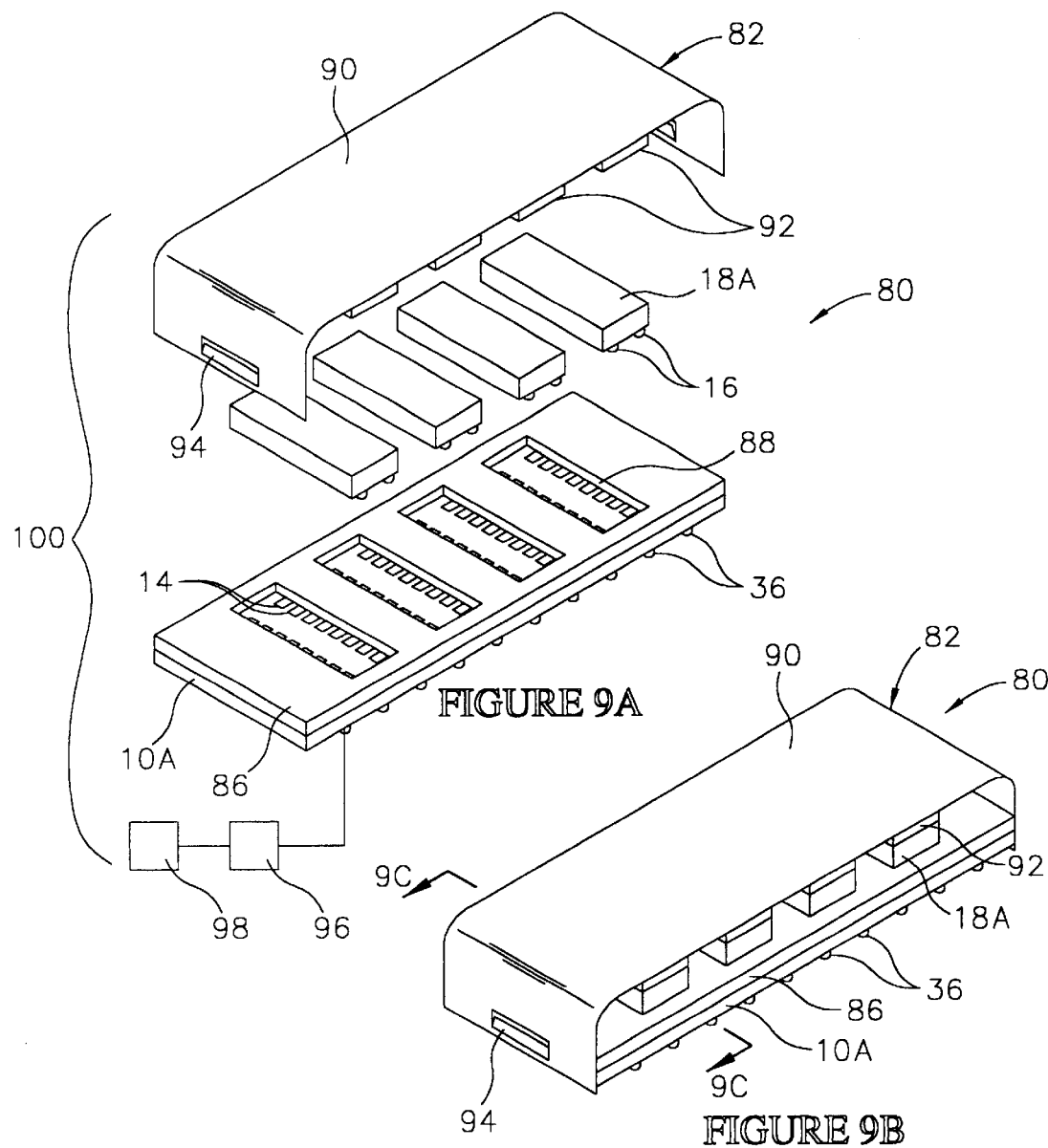
FIGURE 9A
FIGURE 9B
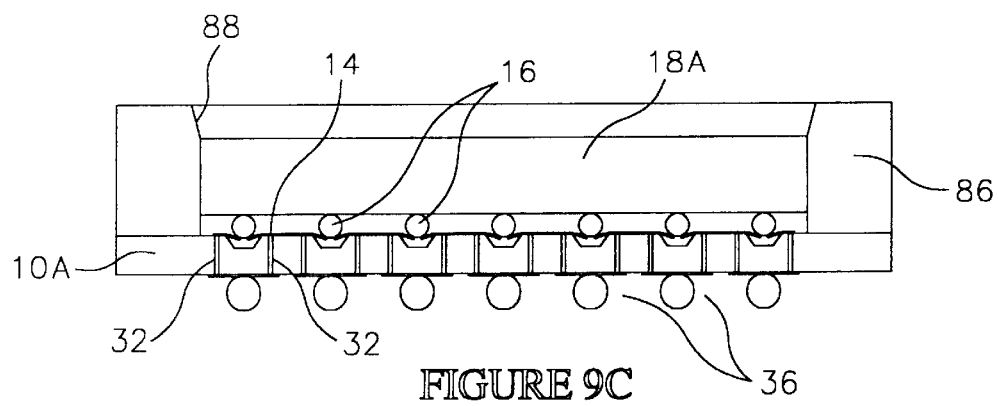
FIGURE 9C

METHOD FOR FABRICATING A TEST INTERCONNECT FOR BUMPED SEMICONDUCTOR COMPONENTS

CROSS REFERENCE TO RELATED APPLICATIONS

This application is a division of Ser. No. 09/275,791, filed on Mar. 25, 1999, U.S. Pat. No. 6,437,591.

FIELD OF THE INVENTION

This invention relates generally to the manufacture and testing of semiconductor components. More particularly, this invention relates to an interconnect for electrically engaging bumped semiconductor components.

BACKGROUND OF THE INVENTION

Semiconductor components, such as bare dice, chip scale packages, BGA devices and wafers can include terminal contacts in the form of bumped contacts. This type of component is sometimes referred to as a "bumped" component (e.g., bumped die, bumped wafer).

The bumped contacts provide a high input/output capability for a component, and permit the component to be surface mounted, or alternately flip chip mounted, to a mating substrate, such as a printed circuit board (PCB). Typically, the bumped contacts comprise solder balls, which permits the components to be bonded to the mating substrate using a solder reflow process. For some components, such as chip scale packages and BGA devices, the bumped contacts can be arranged in a dense array, such as a ball grid array (BGA), or a fine ball grid array (FBGA).

For performing test procedures on bumped semiconductor components it is necessary to make temporary electrical connections with the bumped contacts. Different types of interconnects have been developed for making these electrical connections. For example, a wafer probe card is one type of interconnect that is used to test semiconductor wafers. Another type of interconnect, is contained within a carrier for temporarily packaging singulated components, such as bare dice and chip scale packages, for test and burn-in. The interconnects include contacts that make the electrical connections with bumped contacts.

One problem with making these temporary electrical connections is that the sizes of the bumped contacts on a component can vary. Some bumped contacts can have a larger diameter and a greater height than other bumped contacts on the same component. Also, if the interconnect is used to test different components the sizes of the bumped contacts can vary between components. The interconnect contacts may not be able to accommodate these size differences, making reliable electrical connections difficult to make. This problem is compounded because the interconnect contacts must penetrate native oxide layers on the bump contacts to make low resistance electrical connections.

Another problem with bumped contacts particularly solder balls, is that the contacts deform easily during handling and testing, especially at elevated temperatures. For performing test procedures, it may be difficult to make low resistance electrical connections with deformed contacts. Specifically, the contacts on the interconnect may not adequately engage and penetrate the surfaces of the bumped contacts unless large contact forces are employed. However, the large contact forces can also deform the bumped contacts. For subsequent bonding procedures, deformed contacts can make alignment and bonding of the component with a mating substrate more difficult. In addition, deformed contacts are a cosmetic problem that can adversely affect a users perception of a semiconductor component.

The present invention is directed to an interconnect for making temporary electrical connections with semiconductor components having bumped contacts. The interconnect includes contacts constructed to electrically engage the bumped contacts, and to accommodate variations in the size and planarity of the bumped contacts.

SUMMARY OF THE INVENTION

In accordance with the present invention, an improved interconnect for testing bumped semiconductor components, a method for fabricating the interconnect, and test systems incorporating the interconnect, are provided. The interconnect includes a substrate and a plurality of flexible contacts on the substrate for electrically engaging bumped contacts on a component under test. The interconnect also includes conductors formed on surfaces of the substrate, and conductive vias formed within the substrate, in electrical communication with the flexible contacts and with external contacts on the substrate.

The flexible contacts are formed on the substrate in a pattern, such as a dense grid array, that matches a pattern of the bumped contacts on the component. A first embodiment contact comprises a recess in the substrate, and a support member suspended on the recess for supporting a mating bumped contact on the component. A plurality of cantilevered leads support the support member, and are shaped to allow the support member to move in a z-direction into the recess during electrical engagement of the bumped contact. The cantilevered leads have a spiral or twisted configuration similar to impeller vanes on a centrifugal pump. As the support member and bumped contact are moved into the recess by an external biasing force, the cantilevered leads function as torque springs. In addition, the leads twist the support member relative to the bumped contact to facilitate penetration of oxide layers thereon.

A second embodiment flexible contact comprises a raised support member suspended over the substrate on spring segment leads. The spring segment leads have a spiral or twisted configuration that allows the support member to move towards the substrate, and to twist relative to the bumped contact.

The support member can comprise a ring with an opening having a peripheral edge for penetrating the bumped contact. Alternately, the support member can comprise a solid plate having one or more penetrating projections, for penetrating the bumped contact. In addition, the cantilevered leads, or the spring segment leads, can have a serpentine configuration to allow extension thereof during movement of the support member into the recess. Preferably, the support member comprises a non-bonding metal, or includes an outer layer that will not bond to the bumped contact. For example, for a bumped contact formed of solder, the support member can include a non-solder wettable outer layer.

The first embodiment contacts can be fabricated by forming recesses in the substrate, forming the conductors and conductive vias in the substrate, and then attaching a separate polymer film having the cantilevered leads thereon to the conductors. Alternately, the first embodiment contacts can be fabricated by forming recesses in the substrate, forming resist layers in the recesses, depositing a metal layer on the substrate and resist layers, patterning the metal layer to form the support member and cantilevered leads, and then removing the resist layers in the recesses.

The second embodiment contacts can be fabricated by forming polymer bumps on the substrate, forming the conductors on the substrate and conductive vias in the substrate, forming metal layers on the polymer bumps, etching the metal layers to form the support member and spring segment leads, and then removing the polymer bumps.

For fabricating a die level test system, the interconnect can be configured for use with a test carrier configured to retain discrete semiconductor components, such as bare dice and packages, for electrical connection to test circuitry. For fabricating a wafer level test system, the interconnect can be configured for use with a wafer prober configured to apply test signals to dice contained on a semiconductor wafer.

BRIEF DESCRIPTION OF THE DRAWINGS

FIG. 2A is an enlarged portion of FIG. 1A taken along section line 2A—2A illustrating a contact on the interconnect;

FIG. 2B is an enlarged cross sectional view taken along section line 2B—2B of FIG. 2A;

FIG. 2C is an enlarged cross sectional view taken along section line 2C—2C of FIG. 2B;

FIG. 2D is an enlarged cross sectional view taken along section line 2D—2D of FIG. 2A;

FIG. 9A is an exploded schematic perspective view of a test carrier that includes an interconnect constructed in accordance with the invention;

FIG. 9B is a schematic perspective view of the assembled test carrier;

FIG. 9C is an enlarged schematic cross sectional view, with parts removed, of the test carrier taken along section line 9C—9C of FIG. 9B;

DETAILED DESCRIPTION OF THE PREFERRED EMBODIMENTS

Figure 1A:
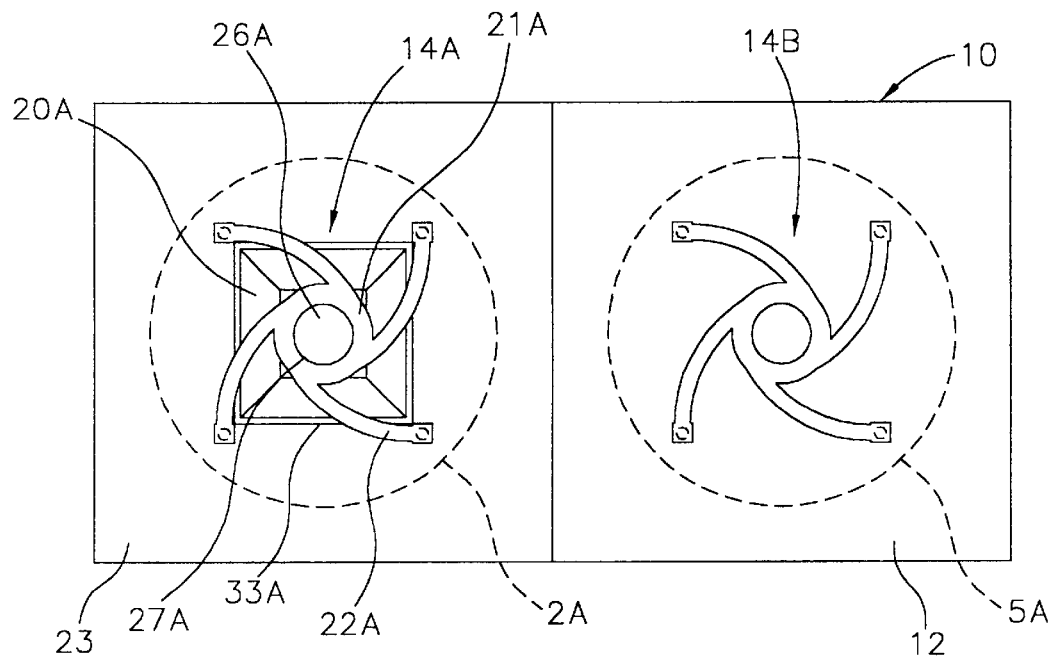
FIG. 1A is a schematic plan view of an interconnect constructed in accordance with the invention.
Figure 3A:
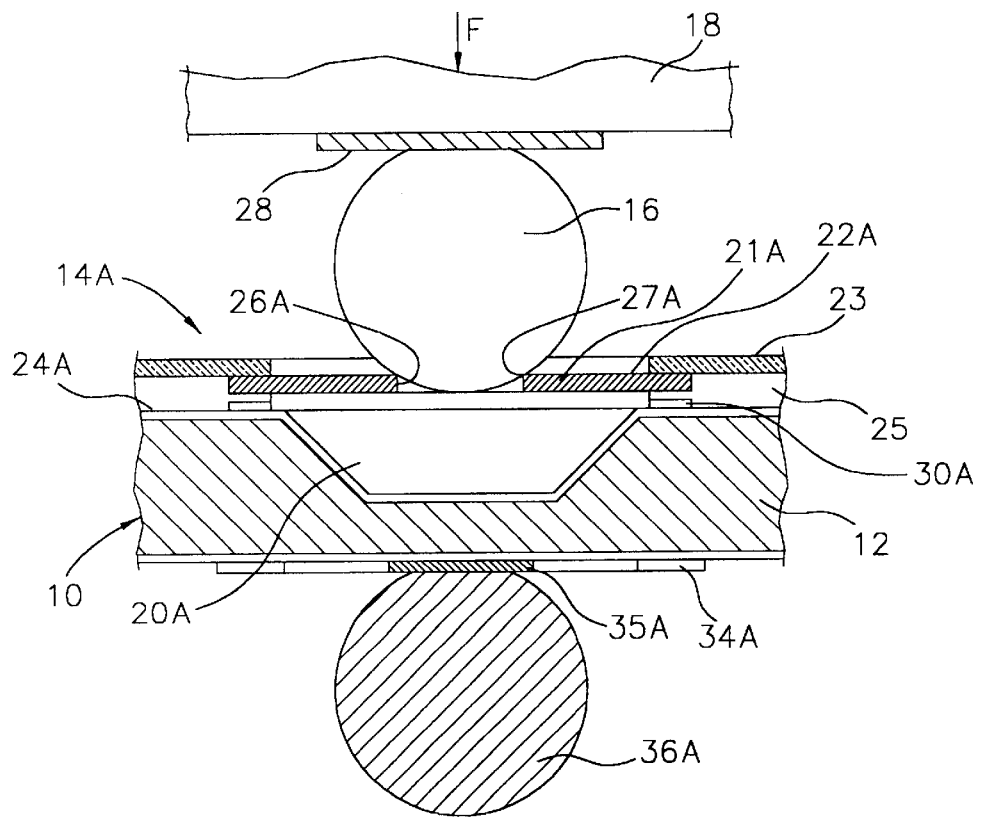
FIG. 3A is an enlarged cross sectional view equivalent to FIG. 2B illustrating the contact electrically engaging a bumped contact on a semiconductor component.

Referring to FIG. 1A, an interconnect 10 constructed in accordance with the invention is illustrated. The interconnect 10 includes a substrate 12, and a pattern of contacts 14A or 14B formed on the substrate 12. The contacts 14A or 14B are adapted to electrically engage bumped contacts 16 (FIG. 3A) formed on land pads 28 (FIG. 3A) on a semiconductor component 18 (FIG. 3A).

As used herein, the term "semiconductor component" refers to an electronic component that includes a semiconductor die. Exemplary semiconductor components include bare semiconductor dice, chip scale packages, ceramic or plastic semiconductor packages, BGA devices, semiconductor wafers, and panels containing multiple chip scale packages.

Figure 1B:
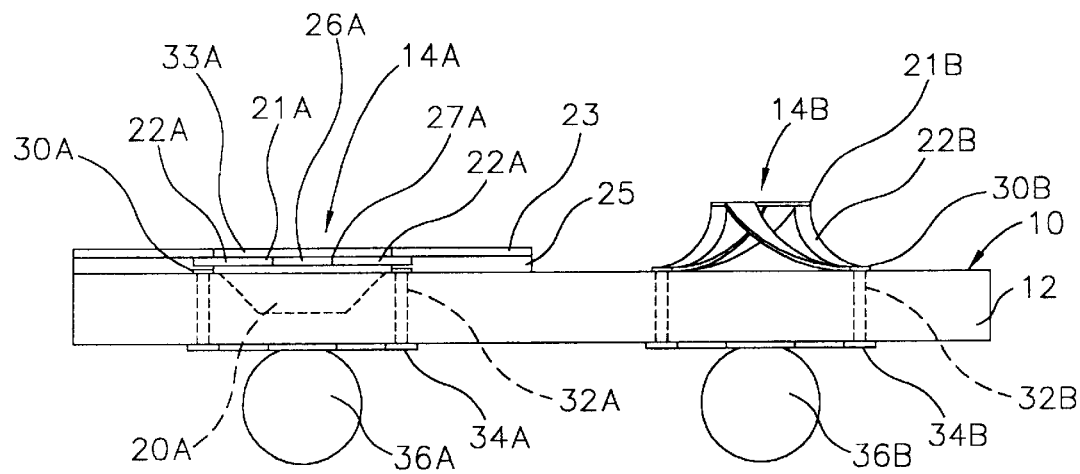
FIG. 1B is a side elevation view of FIG. 1A.

For illustrative purposes, two different contact embodiments are illustrated in FIG. 1. However, in actual practice the interconnect 10 will contain only one type of contact, either contact 14A, or contact 14B. Also for illustrative purposes, only one contact for each embodiment is illustrated on the interconnect 10. However, in actual practice the interconnect 10 will contain enough contacts 14A or 14B to electrically engage all of the bumped contacts 16 (FIG. 3A) on the component 18 (FIG. 3A) at the same time. In addition, a pattern of the contacts 14A or 14B will exactly match a pattern of the bumped contacts 16 (FIG. 3A) on the component 18 (FIG. 3A). For example, if the bumped contacts 16 are formed on the component 18 in a dense array, such as a ball grid array (BGA), the contacts 14A or 14B will have a corresponding dense grid array.

Referring to FIGS. 2A–2D, the first embodiment contact 14A comprises a recess 20A in the substrate 12, a support member 21A suspended over the recess 20A, and a plurality of cantilevered leads 22A for supporting the support member 21A over the recess 20A. As will be further explained, the support member 21A and cantilevered leads 22A are formed on a separate polymer film 23 (FIG. 2B) attached to the substrate 12 using a conductive polymer layer 25. In addition, the contact 14A is configured to compensate for variations in the size (e.g., diameter, height), shape, and planarity of the bumped contacts 16 (FIG. 3A) on the component 18 (FIG. 3A).

The substrate 12 can comprise a semiconductor material such as monocrystalline silicon, germanium, silicon-onglass, or silicon-on-sapphire. In addition, an electrically insulating layer 24A (FIG. 2B) can be formed on exposed surfaces of the substrate 12 and within the recess 20A for electrically insulating the contact 14A from a bulk of the substrate 12. However, as will be further explained, the substrate 12 can also comprise an electrically insulating material, such as ceramic or plastic, such that electrically insulating layers are not be required. Exemplary plastics include epoxy novolac resin, silicone, phenylsilane and thermoset plastics.

The recess 20A can be formed in the substrate 12 using an etching process, a laser machining process or a molding process. In the embodiment illustrated in FIG. 2A–2D, the recess 20A is generally square shaped, and the contact 14A includes four cantilevered leads 22A. Alternately the recess 20A can have other shapes, such as rectangular, circular, or oval. The recess 20A is sized and shaped to retain and center the bumped contacts 16.

As shown in FIG. 2B, the recess 20A has a width W and a depth X. The width W and depth X are approximately equal to the diameter and height of the bumped contacts 16. Preferably, the diameter W of the recess 20A is equal to, or greater than, a diameter of the bumped contacts 16. A representative range for the width W can be from 2 mils to 50 mils. In addition, the depth X (FIG. 2B) of the recess 20A can be selected such that the support member 21A, can move in the z-direction within the recess 20A, by a distance sufficient to accommodate variations in the size, shape and planarity of the bumped contacts 16. For example, the depth X of the recess 20A can be equal to, or less than, a height of the bumped contacts 16. A representative range for the depth X can be from 1 mils to 25 mils.

As shown in FIG. 2A, the support member 21A is generally circular in shape. The support member 21A can be formed integrally with the leads 22A and of a same metal as the leads 22A. The support member 21A includes a circular opening 26A sized to retain the bumped contact 16 (FIG. 3A). In addition, the opening 26A includes a peripheral edge 27A configured to penetrate the bumped contact 16 (FIG. 3A) as the support member 21A moves into the recess 20A.

With the contact 14A, there are four leads 22A equally angularly spaced along a periphery of the support member 21A. Also, the leads 22A are twisted in a clock wise direction relative to a longitudinal axis 29A (FIG. 2B) of the contact 14A. The configuration of the leads 22A is similar to the vanes of an impeller of a centrifugal pump and can also be described as being spiral. However, the leads 22A can be formed in different configurations than the one shown (e.g., counter clock wise spiral, spoke pattern). Also, the contact 14A can include a lesser, or a greater number of leads 22A, with at least two or more leads necessary to support the support member 21A.

With the leads 22A having a spiral configuration the support member 21A can move in a z-direction into the recess 20A, as the bumped contact 16 is pressed into the contact 14A by an external biasing force. During movement of the support member 21A into the recess 20A, a torque is exerted on the support member 21A by the leads 22A. In addition, the support member 21A twists (i.e., rotates) about the longitudinal axis 29A of the contact 14A. This twisting motion also rotates the support member 21A relative to the bumped contact 16, such that the peripheral edge 27A of the opening 26A penetrates native oxide layers that may be present on the bumped contact 16. This insures that the underlying metal of the bumped contact 16 is contacted such that a low resistance electrical connection is made.

Preferably the leads 22A comprise a highly conductive metal such as aluminum, titanium, nickel, iridium, copper, gold, tungsten, silver, platinum, palladium, tantalum, molybdenum, or alloys of these metals. As shown in FIG. 2B, the leads 22A can also include an outer layer 31A, which comprises a material selected to provide a non-bonding surface for the bumped contacts 16. For example, for bumped contacts 16 formed of solder, the outer layer 31A can comprise a metal that is not solder wettable. Suitable metals include Ti, $TiSi_2$ and Al. Rather than metal, the outer layer 31A can comprise a conductive polymer selected to provide a non-bonding surface. Suitable conductive polymers include carbon films and metal filled silicone.

As also shown in FIG. 2B, in the contact 14A, the leads 22A are formed on the polymer film 23 which is attached to the substrate 12. The polymer film 23 can be similar to multi layered TAB tape such as "ASMAT" manufactured by Nitto Denko. Alternately as will be further explained, the leads 22A can be formed directly on the substrate 12A using a metallization process such as CVD or electrodeposition.

The polymer film 23 comprises a thin flexible polymer such as polyimide. The leads 22A and support member 21A can be formed by depositing (e.g., electrodeposition) or attaching (e.g., lamination) a metal layer to the polymer film 23 and then patterning the metal layer. In addition, the polymer film 23 includes openings 33A (FIG. 2A) that correspond in size and shape to the recesses 20A. The openings 33A provide access to the contact 14A for the bumped contact 16.

As also shown in FIG. 2B, the contact 14A includes conductors 30A formed on a first surface of the substrate 12, and conductors 34A formed on a second opposing surface of the substrate 12. The conductors 30A and the conductors 34A can comprise a same metal as the leads 22A and support member 21A. As shown in FIG. 2D, conductive vias 32A electrically connect the conductors 30A to the conductors 34A. The conductive vias 32A comprise through openings in the substrate 12 at least partially filled with a metal or conductive polymer. The conductive vias 32A are electrically insulated from the substrate 12 by the insulating layer 24A.

As also shown in FIGS. 2B and 2D, the conductive polymer layer 25 electrically connects the conductors 30A on the substrate 12 to the leads 22A on the polymer film 23. The conductive polymer layer 25 can comprise a metal filled silicone, a carbon filled ink, or an isotropic or anisotropic adhesive. Suitable conductive polymers are sold by A.I. Technology, Trenton, N.J.; Sheldahl, Northfield, Minn.; 3M, St. Paul, Minn.

As shown in FIG. 2C, the conductors 34A are in electrical communication with a bonding pad 35A formed on the second surface of the substrate 12. A terminal contact 36A is attached to the bonding pad 35A. The terminal contact 36A provides a connection point from the outside to the contact 14A. The terminal contact 36A can comprise a metal ball attached to the bonding pad 35A using a suitable bonding process such as soldering, brazing, or welding. Alternately other types of terminal contacts 36A such as planar pads, pins or shaped leads can be employed in place of metal balls.

Figure 3B:
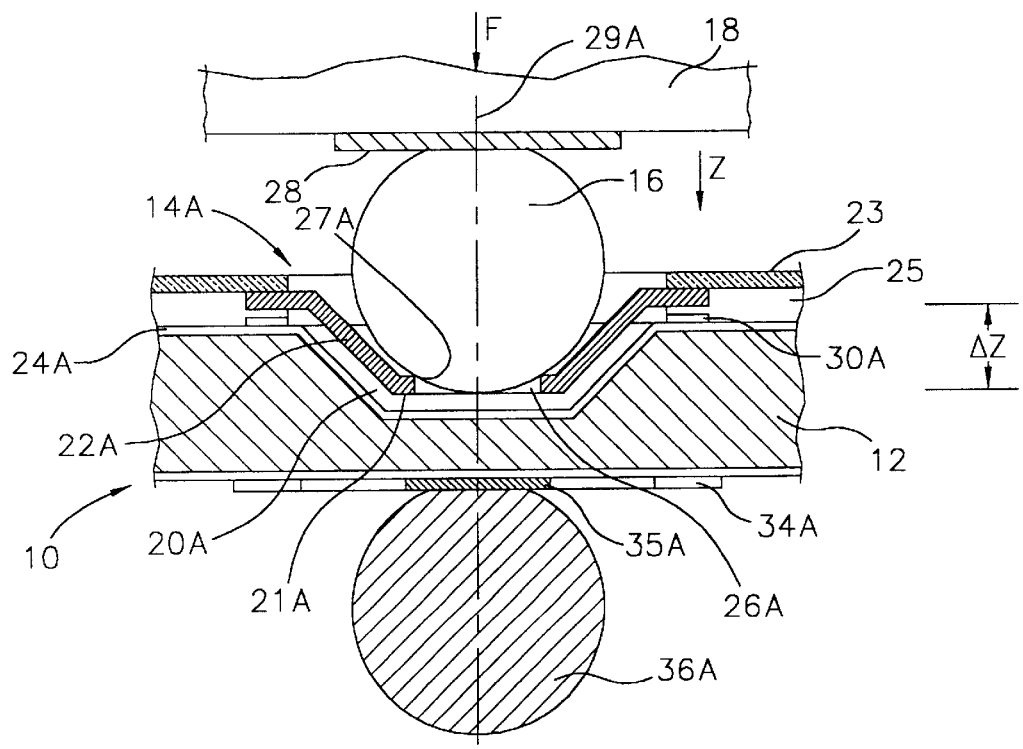
FIG. 3B is an enlarged cross sectional view equivalent to FIG. 3A illustrating the contact flexing during electrical engagement of the bumped contact.

Referring to FIGS. 3A and 3B, the contact 14A is illustrated during electrical engagement of the bumped contact 16 on the component 18. During electrical engagement an external biasing force F is exerted on the component 18, or alternately on the interconnect 10 to bias the component 18 against the interconnect 10. As will be further explained, the biasing force F is generated by a testing apparatus on which the interconnect 10 is mounted.

Prior to engaging the contact 14A, the bumped contact 16 is aligned with the opening 26A in the support member 21A of the contact 14A. As will be further explained alignment can be accomplished with an alignment fence or using optical alignment techniques. As the bumped contact 16 makes initial contact with the support member 21A the opening 26A helps to center and retain the bumped contact 16.

As shown in FIG. 3B, following initial contact, the component 18 and bumped contact 16 are overdriven in the z-direction into the recess 20A. At the same time the leads 22A flex and twist about the longitudinal axis 29A in a clockwise direction. The support member 21A also twists relative to the bumped contact 16 such that the peripheral edge 27A of the opening 26A penetrates and forms a peripheral groove in the bumped contact 16. In addition, the movement of the bumped contacts 16 into the recesses 20A helps to compensate for variations in the size and planarity of the bumped contacts 16. For example, bumped contacts 16 that have a lesser height will not descend into the recess 20A by the same amount as bumped contacts 16 with a greater height. In general, the amount of travel z of the support member 21A is a function of the depth X (FIG. 3B) of the recess 20A.

Figure 4A:
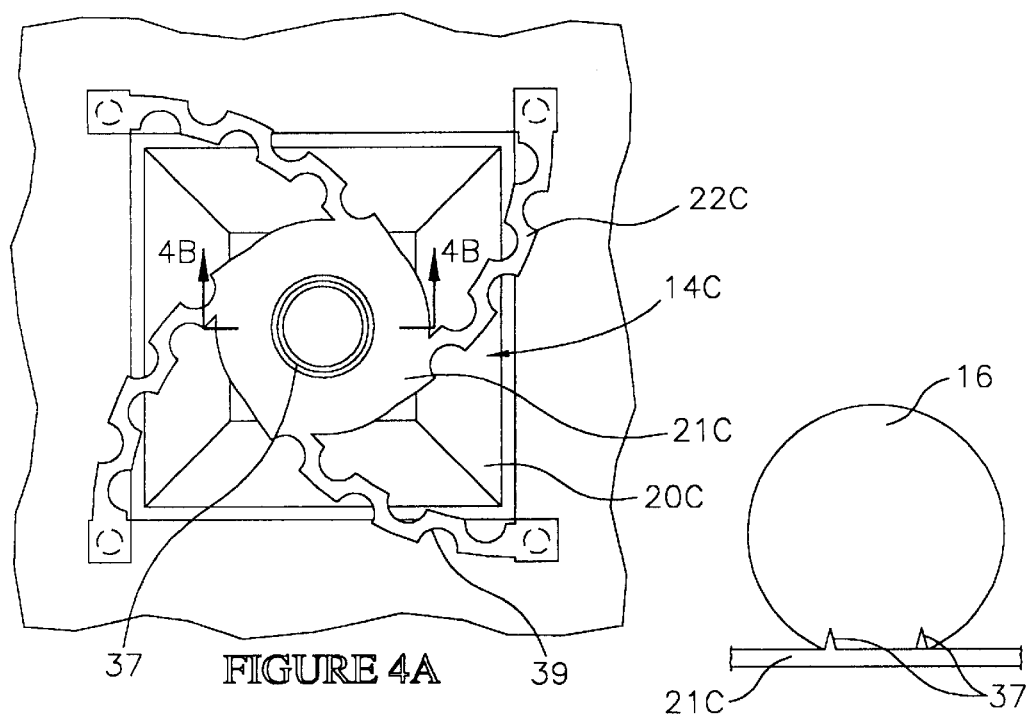
FIG. 4A is an enlarged plan view equivalent to FIG. 2A illustrating an alternate embodiment of the contact of FIG. 2A.
Figure 4B:
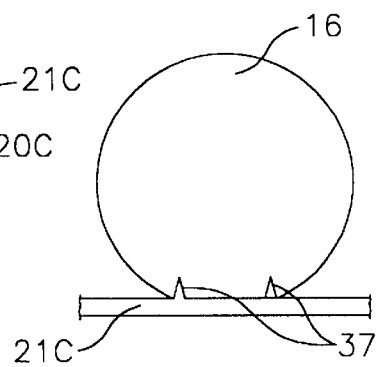
FIG. 4B is an enlarged cross sectional view taken along section line 4B—4B of FIG. of FIG. 4A.

Referring to FIGS. 4A and 4B, an alternate embodiment contact 14C is illustrated. The contact 14C is constructed substantially as previously described for contact 14A. However, a support member 21C for the contact 14C comprises a solid plate with a peripheral blade 37. The blade 37 functions in the same manner as the opening 26A (FIG. 3A) and peripheral edge 27A (FIG. 3A) previously described to penetrate the bumped contact 16. Also in the contact 14C, cantilevered leads 22C are extensible due to scallops 39 formed therein. The extensible leads 22C facilitate movement of the support member 21C into a recess 20C of the contact 14C.

Figure 4C:
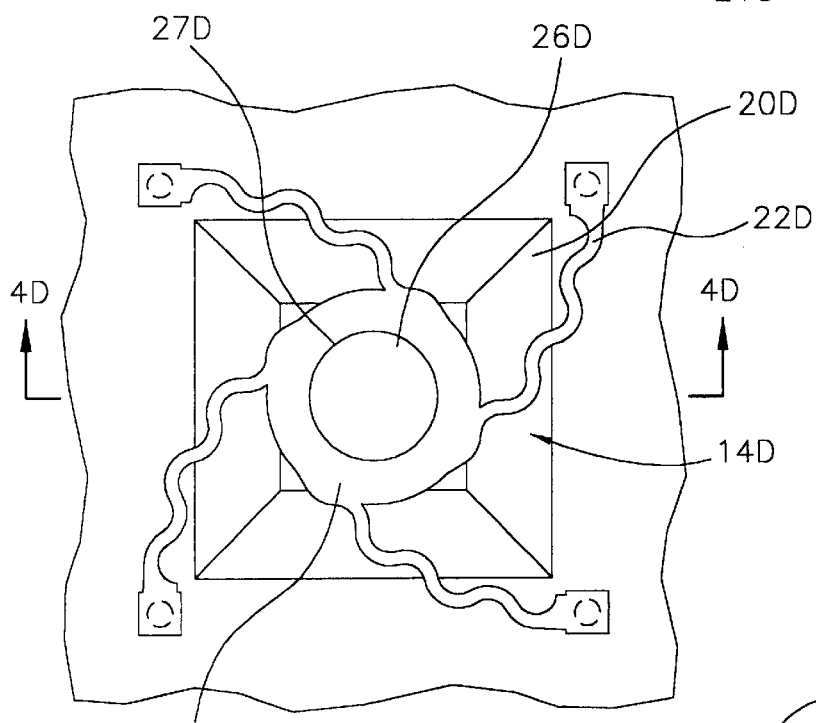
FIG. 4C is an enlarged plan view equivalent to FIG. 2A illustrating another alternate embodiment of the contact of FIG. 2A.
Figure 4D:
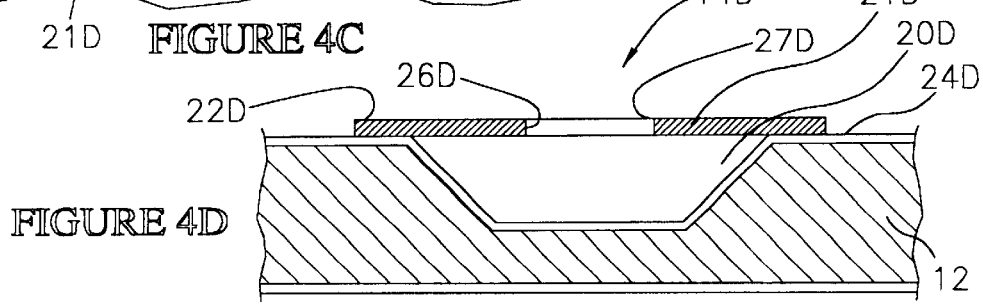
FIG. 4D is an enlarged cross sectional view taken along section line 4D—4D of FIG. 4C.

Referring to FIGS. 4C and 4D, an alternate embodiment contact 14D is illustrated. The contact 14D includes a recess 20D and a support member 21D suspended over the recess 20D. The support member 21D includes an opening 26D with a peripheral edge 27D. The contact 14D also includes extensible cantilevered leads 22D having a serpentine configuration. The contact 14D functions substantially the same as previously described contact 14A. However, in this embodiment the leads 22D are formed directly on an insulating layer 24D on the substrate 12, rather than on a separate polymer film 23 (FIG. 4B) attached to the substrate 12.

Figure 5A:
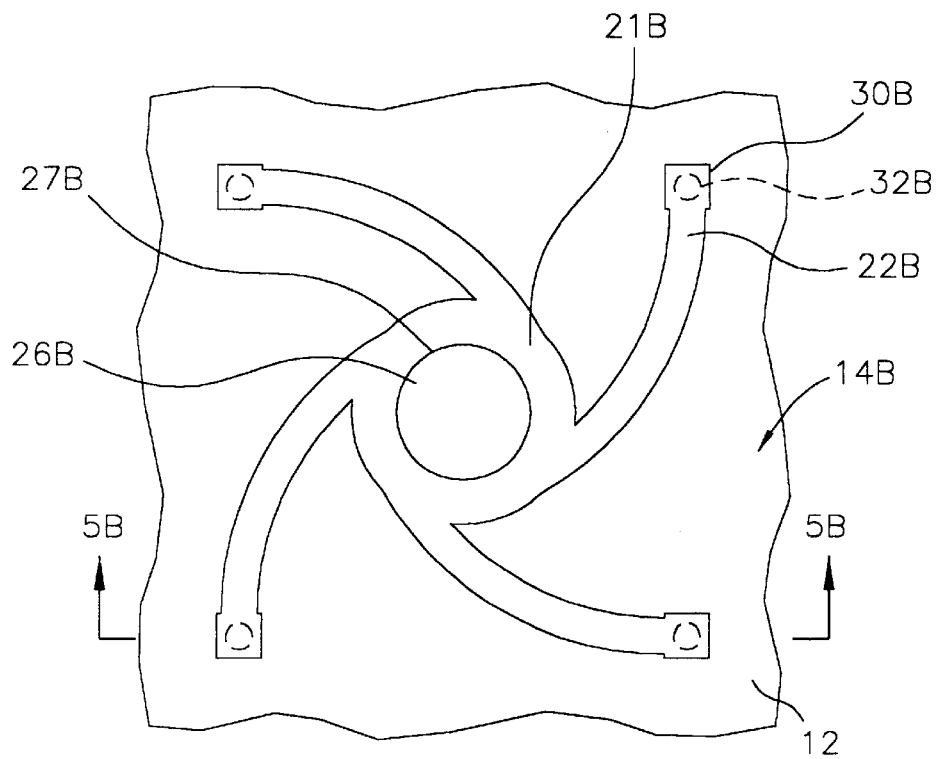
FIG. 5A is an enlarged portion of FIG. 1A taken along section line 5A illustrating an alternate embodiment contact on the interconnect.
Figure 5B:
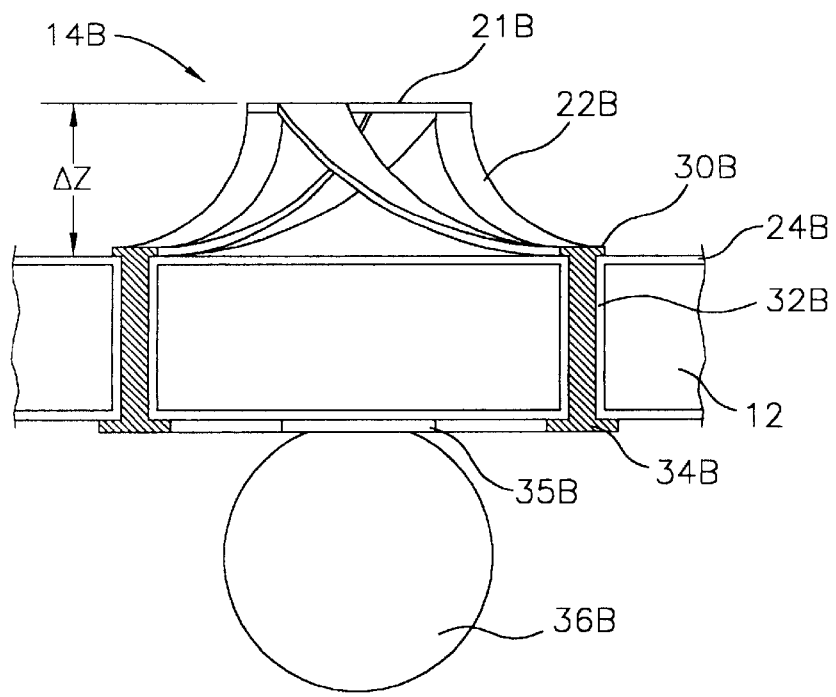
FIG. 5B is an enlarged cross sectional view taken along section line 5B—5B of FIG. 5A.

Referring to FIGS. 5A and 5B, alternate embodiment contact 14B is illustrated. The contact 14B includes a support member 21B having an opening 16B with a peripheral edge 27B. In addition, the contact 14B includes four spring segment leads 22B formed on the substrate 12 in electrical communication with a pattern of conductors 30B on the first surface of the substrate 12. The contact 14B also includes conductive vias 32B in the substrate 12, conductors 34B formed on the second surface of the substrate 12, and a terminal contact 36B formed on a bonding pad 35B substantially as previously described. In addition, electrically insulating layers 24B are formed on exposed surfaces of the substrate 12 and within the conductive via 32B, substantially as previously described.

In this embodiment, the contact 14B does not include a recess in the substrate 12. Rather the support member 21B is suspended on the substrate 12 by the spring segment leads 22B. However, the support member 21B is able to move in a z-direction towards the substrate 12 upon engagement with the bumped contact 16 (FIG. 3A) under an external biasing force F (FIG. 3A). In addition, the spring segment leads 22B have a spiral, or twisted configuration, substantially as previously described for leads 22A (FIG. 2A). The spring segment leads 22B thus exert a torque on the support member 21B, and allow the support member 21B to twist relative to the bumped contacts 16 substantially as previously described for contact 14A (FIG. 2A). Once the external biasing force F (FIG. 3A) and the bumped contact 16 are removed, the natural resiliency of the spring segment leads 22B allows the support member 21B to return to the raised position. The amount of travel z of the support member 21B is a function of the height of the support member 21B above the substrate 12.

Figure 6A:
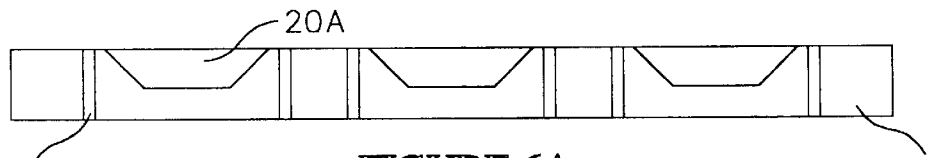
FIGS. 6A–6E are schematic cross sectional views illustrating steps in a method for fabricating the contact of FIG. 2A–2B.

Referring to FIGS. 6A–6G, steps in a method for fabricating the interconnect 10 (FIG. 1) with the contact 14A (FIG. 2A) are illustrated. Initially as shown in FIG. 6A, the substrate 12 is provided. In the illustrative method, the substrate 12 comprises monocrystalline silicon. Preferably, the substrate 12 is provided as a wafer of material on which multiple interconnects 10 (FIG. 1) can be fabricated and then singulated by saw cutting or shearing.

As also shown in FIG. 6A, the recesses 20A can be formed in the substrate using an etch process. For performing the etch process, a mask (not shown) such as a resist mask or a hard mask, can be formed on the substrate 12. The mask can include openings corresponding to the desired size and shape of the recesses 20A. A wet etchant can then be applied through the openings in the mask to etch the recesses 20A to a desired depth.

For example, the recesses 20A can be etched using an anisotropic etch process. With an anisotropic etch process, the recesses 20A will have straight sidewalls, sloped at an angle of about 55° with respect to the surface of the substrate 12. With the substrate 12 comprising silicon, one suitable etchant for performing an anisotropic etch is a solution of $KOH:H_2O$. Alternately, rather than an anisotropic etch process, an isotropic etch process can be used, to form the recesses 20A. In this case, the recesses 20A will have curved sidewalls (not shown). With the substrate 12 comprising silicon, one suitable etchant for performing an isotropic etch is a solution of HF, $HNO_3$ and $H_2O$.

If the substrate 12 comprises ceramic, the recesses 20A can also be formed using an etching process and a wet etchant such as HF. If the substrate 12 comprises a plastic the recesses 20A can be formed using a micro molding process, or a laser machining process.

As also shown in FIG. 6A, openings 38 can be formed for the conductive vias 32A. One method for forming the openings 38 is laser machining. A suitable laser machining apparatus for forming the openings 38 is manufactured by General Scanning of Sommerville, Mass. and is designated a Model No. 670-W. Another suitable laser machining apparatus is manufactured by Synova S.A., Lausanne, Switzerland.

A representative diameter of the openings 38 can be from 10 $\mu$m to 2 mils or greater. A representative fluence of a laser beam for forming the openings 38 with the substrate 12 comprising silicon and having a thickness of about 28 mils, is from 2 to 10 watts/per opening at a pulse duration of 20–25 ns and at a repetition rate of up to several thousand per second. The wavelength of the laser beam can be a standard infrared or green wavelength (e.g., 1064 nm–532 nm), or any wavelength that will interact with and heat silicon.

Following formation of the recesses 20A and openings 38, the insulating layers 24A (FIGS. 2B and 2D) can be formed on exposed surfaces of the substrate 12, and in the recesses 20A and openings 38. For simplicity, the insulating layers 24A are not shown in FIGS. 6A–6G. Also, if the substrate 12 comprises an electrically insulating material such as ceramic or plastic, the insulating layers 24A are not required.

The insulating layers 24A (FIGS. 2B and 2D) can comprise an electrically insulating material, such as $SiO_2$ or $Si_3N_4$ deposited using a process such as CVD. A $SiO_2$ layer can also be grown using an oxidizing atmosphere such as steam and $O_2$ at an elevated temperature (e.g., 950° C.). Alternately, the insulating layers 24A can comprise a deposited polymer such as polyimide. One method for depositing a polymer is with a spin on process. Depending on the material, a representative thickness of the insulating layers 24A can be from about 100 Å to several mils.

Figure 6B:
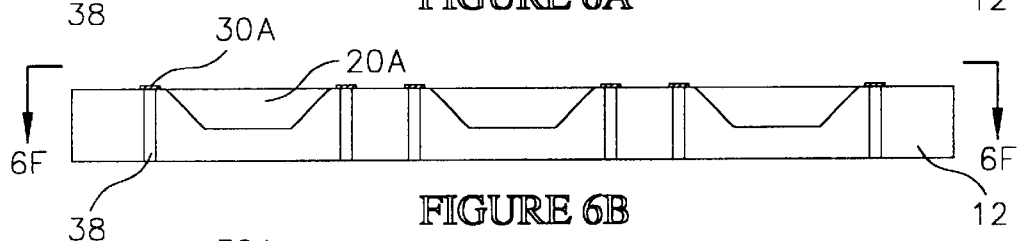

Next, as shown in FIG. 6B, the conductors 30A can be formed on the substrate 12 using a suitable metallization process (e.g., CVD, patterning, etching). Preferably, the conductors 30A comprise a highly conductive metal such as aluminum, titanium, nickel, iridium, copper, gold, tungsten, silver, platinum, palladium, tantalum, molybdenum, or alloys of these metals.

Figure 6C:
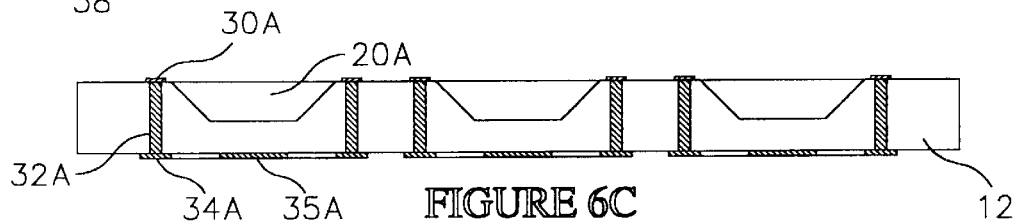

Next, as shown in FIG. 6C, a conductive material can be deposited within the openings 38 to form the conductive vias 32A. The conductive material can comprise a metal, such as aluminum, titanium, nickel, iridium, copper, gold, tungsten, silver, platinum, palladium, tantalum, molybdenum, or alloys of these metals. The metal can be deposited within the openings 38 using a deposition process, such as CVD, electrolytic deposition or electroless deposition. Alternately, a solder alloy can be screen printed into the openings 38, or injected by capillary action, or with a vacuum system using a hot solder wave. In addition, the conductive material can comprise plugs that completely fill the openings 38, or alternately can comprise layers that cover just the inside surfaces or sidewalls of the opening 38.

Also, rather than being a metal, the conductive material can comprise a conductive polymer, such as a metal filled silicone, a carbon filled ink, or an isotropic or anisotropic adhesive. Suitable conductive polymers are sold by A.I. Technology, Trenton, N.J.; Sheldahl, Northfield, Minn.; 3M, St. Paul, Minn. A conductive polymer can be deposited within the openings 38, as a viscous material, and then cured as required. A suitable deposition process, such as screen printing, or stenciling, can be used to deposit the conductive polymer into the openings 38.

At the same time the conductive material is deposited in the openings 38, the conductors 34A and the pads 35A can be formed on the second side of the substrate 12. A suitable mask (not shown) can be used to form the conductors 34A and the pads 35A with a desired thickness and peripheral shape. Alternately, the conductors 34A and the pads 35A can comprise a different material than the conductive material for the conductive vias 32A, and can be formed using a separate deposition or metallization process. For example, the conductors 34A and the pads 35A can comprise a bondable or solderable metal such as copper or aluminum, while the conductive material can comprise a material such as nickel.

Figure 6D:
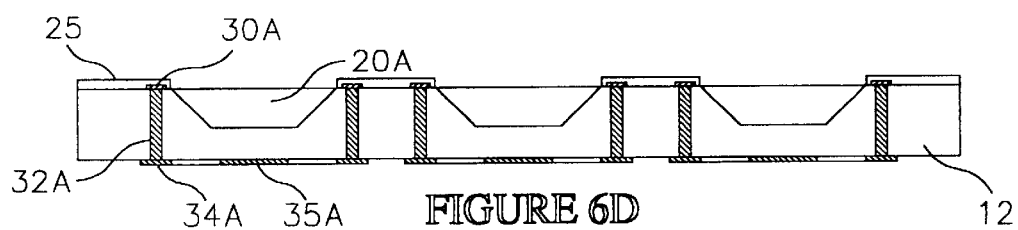
Figure 6E:
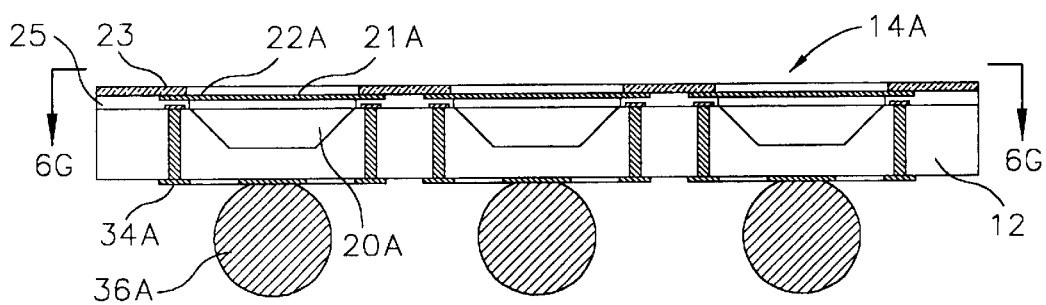
Figure 6F:
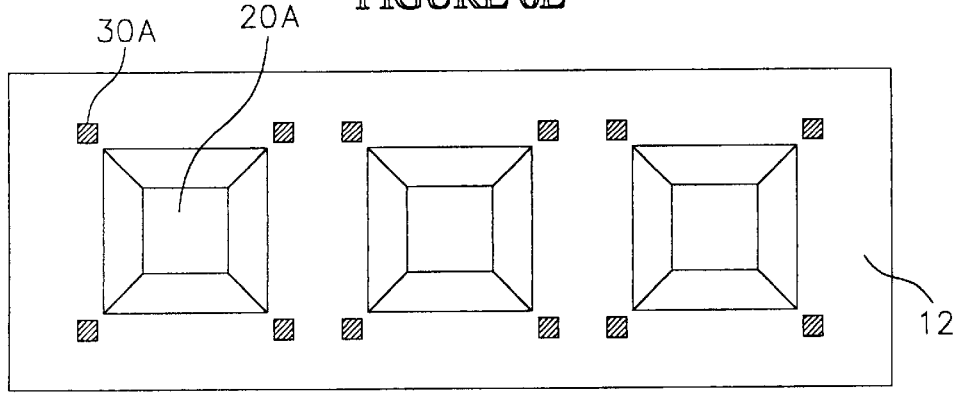
FIG. 6F is a plan view taken along section line 6F—6F of FIG. 6B.
Figure 6G:
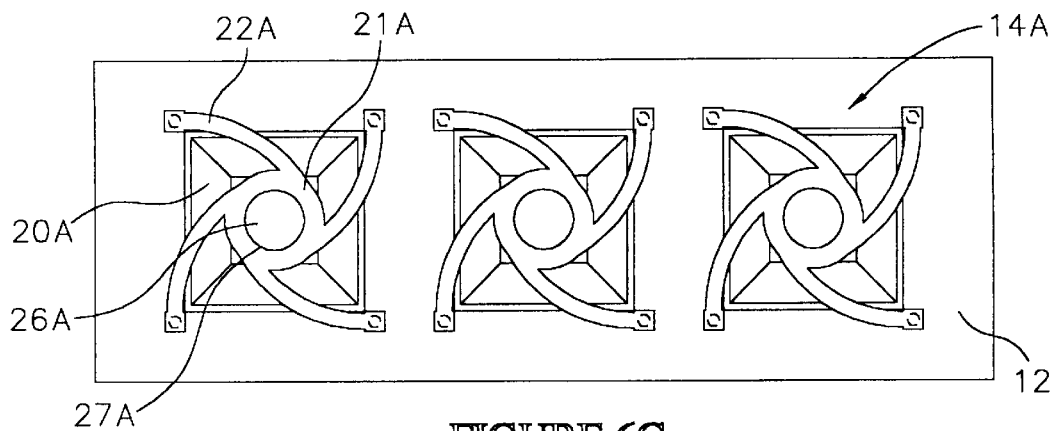
FIG. 6G is a plan view taken along section line 6G—6G of FIG. 6E.

Next, as shown in FIG. 6D, the conductive polymer layer 25 can be formed on the substrate 12 using a suitable deposition process such as screen printing or stenciling. The conductive polymer layer 25 will electrically connect the conductors 30A on the substrate 12 to the leads 22A (FIG. 6E) on the polymer film 23 (FIG. 6E). In addition, the conductive polymer layer 25 functions to attach the polymer film 23 (FIG. 6E) to the substrate 12. The conductive polymer layer 25 can comprise a metal filled silicone, a carbon filled ink, an isotropic adhesive, or an anisotropic adhesive. Suitable conductive polymer materials are sold by A.I. Technology, Trenton, N.J.; Sheldahl, Northfield, Minn.; 3M, St. Paul, Minn. Alternately rather than being initially applied to the substrate 12, the conductive polymer layer 25 can be initially applied to the polymer film 23.

Next, as shown in FIG. 6E, the polymer film 23 can be attached to the substrate 12 using the conductive polymer layer 25. Depending on the material, the conductive polymer layer 25 can be cured using heat and compression as required. Prior to attaching the polymer film 23 to the substrate 12, the support members 21A and leads 22A can be aligned with the recesses 20A in the substrate 12. As previously explained, the polymer film 23 can be similar to multi layered TAB tape, and can be fabricated using techniques that are known in the art. For example, the support members 21A and leads 22A can be formed in a desired configuration on a polyimide film using an electrodeposition process. Also required features such as the opening 26A (FIG. 6G), peripheral edge 27A (FIG. 6G) or blades 37 (FIG. 4B) can be formed as required.

As also shown in FIG. 6E, the terminal contacts 36A can be attached to the pads 35A using a soldering, brazing or welding process. The terminal contacts 36A can be formed of a relatively hard metal such as nickel, copper, beryllium copper, alloys of nickel, alloys of copper, alloys of beryllium copper, nickel-cobalt-iron alloys and iron-nickel alloys. These relatively hard metals will allow the terminal contacts 36A to resist wear and deformation during continued usage of the interconnect 10. The terminal contacts 36A can also comprise a base metal and an outer layer formed of a non-oxidizing metal such as gold, silver, copper or palladium. For some applications, the terminal contacts 36A can comprise a solder alloy such as 95% Pb/5% Sn, 60% Pb/40% Sn, 63% In/37% Sn, or 62% Pb/36% Sn/2% Ag. The terminal contacts 36A can also be a conductive polymer such as an isotropic or anisotropic adhesive.

One method for attaching the terminal contacts 36A to the pads 35A is by bonding pre-fabricated metal balls to the pads 35. For example, pre-fabricated metal balls are manufactured by Mitsui Comtek Corp. of Saratoga, Calif. under the trademark "SENJU SPARKLE BALLS". The metal balls can be attached to the pads 35 by soldering, laser reflow, brazing, welding, or applying a conductive adhesive. A solder ball bumper can also be used to bond the terminal contacts 36A to the pads 35. A suitable solder ball bumper is manufactured by Pac Tech Packaging Technologies of Falkensee, Germany. The terminal contacts 36A can also be formed on the pads 35 using a conventional wire bonder apparatus adapted to form a ball bond, and then to sever the attached wire. The terminal contacts 36A can also be formed by electrolytic deposition or electroless deposition of a metal to form bumps.

A representative diameter for the terminal contacts 36A can be from about 4 mils to 50 mils or more. A pitch of the terminal contacts 36A can be from about 6 mils to 50 mils or more. In addition, the pitch of the pads 35 and the terminal contacts 36A can exactly match the pitch of the contacts 14A or can be different than the contacts 14A.

Figure 7A:
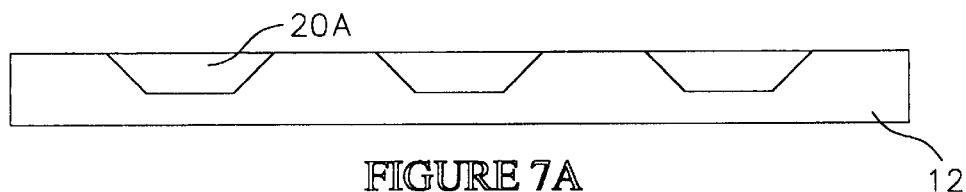
FIGS. 7A–7E are schematic cross sectional views illustrating steps in a method for fabricating an alternate embodiment contact.

Referring to FIGS. 7A–7H, steps in a method for fabricating the interconnect 10 (FIG. 1) with the contact 14D (FIG. 4C) are illustrated. Initially as shown in FIG. 7A, the substrate 12 can be provided and the recesses 20A formed substantially as previously described.

Figure 7B:
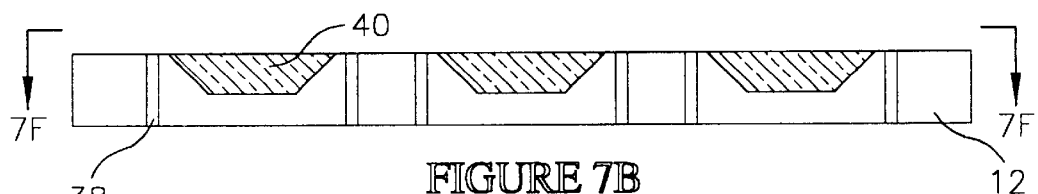

Next, as shown in FIG. 7B, the recesses 20A can be filled with a polymer material 40. One suitable polymer material is a thick film resist sold by Shell Chemical under the trademark "EPON RESIN SU-8". A conventional resist coating apparatus, such as a spin coater, or a meniscus coater, along with a mask or stencil, can be used to deposit the resist in viscous form into the recesses 20A. The resist can then be planarized and cured as required. For example curing can be performed by heating to about 200° C. for about 30 minutes. Rather than a thick film resist, the polymer material 40 can comprise another curable polymer such as polyimide, or photoimageable polyimide.

As also shown in FIG. 7B, following filling of the recesses 20A, openings 38 for conductive vias 32D (FIG. 7C) can be formed in the substrate 12. The openings 38 can be formed using a laser machining process as previously described. FIG. 7F illustrates the pattern of the openings 38 relative to the recesses 20A.

Figure 7C:
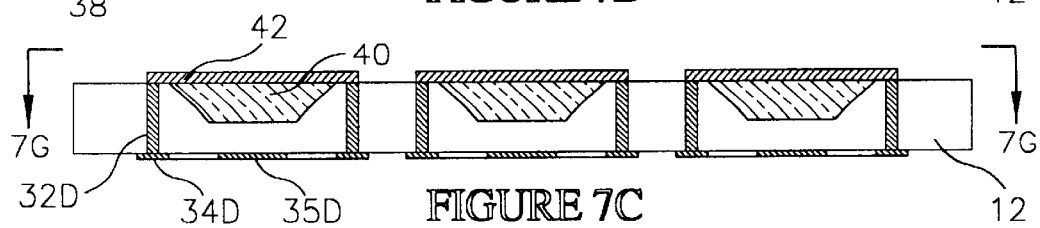

Next, as shown in FIG. 7C, metal layers 42 can be formed on the polymer material 40 and over the openings 38. FIG. 7G illustrates an exemplary layout for the metal layers 42. A deposition process, such as CVD or electrodeposition, can be used to form the metal layers 42. Preferably the metal layers 42 comprise a high yield strength metal, such as tungsten, titanium, nickel, platinum, iridium, or vanadium. A representative thickness of the metal layers 42 can be from 1 $\mu$m to 100 $\mu$m or more. As also shown in FIG. 7C, following (or prior to) deposition of the metal layers 42, the conductive vias 32D, conductors 34D, and pads 35D can be formed substantially as previously described.

Figure 7D:
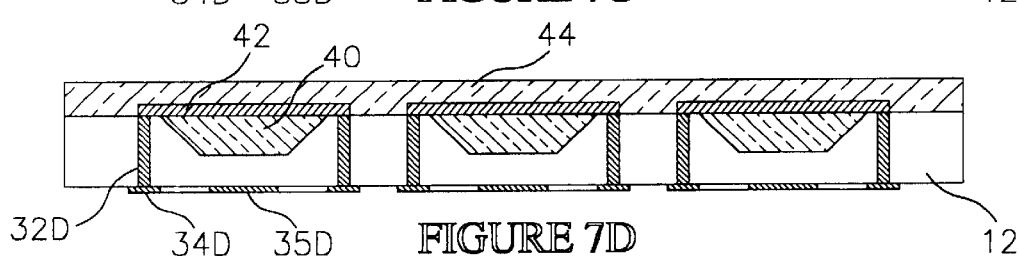

Next, as shown in FIG. 7D, a mask 44 can be formed on the metal layers 42 and used to etch the metal layers 42 in a desired pattern. The mask 44 can comprise a conventional photoresist layer patterned using a conventional photolithography process. Depending on the material for the metal layers 42 a suitable wet etchant can be applied through openings in the mask 44 to etch the metal layers 42.

Figure 7E:
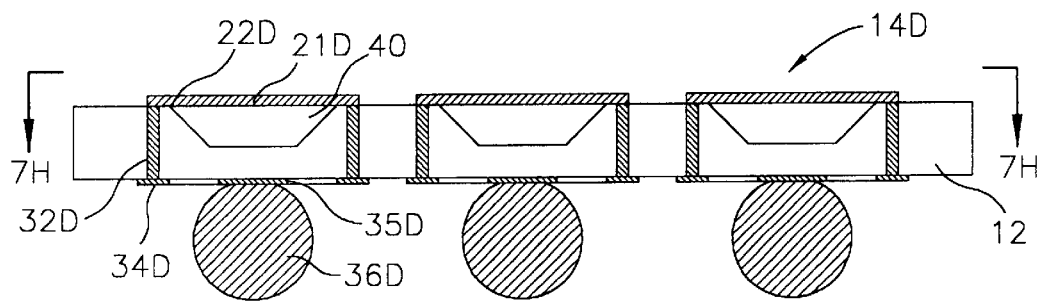
Figure 7F:
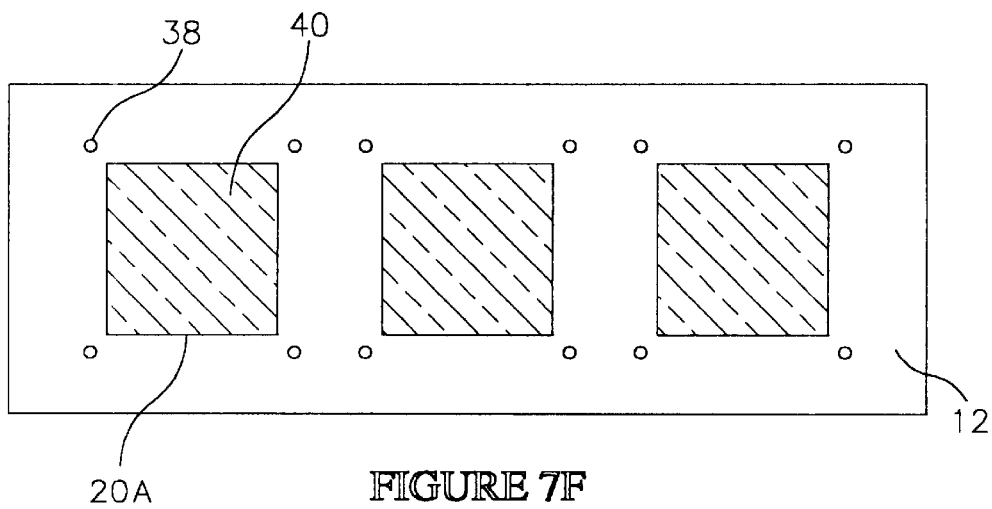
FIG. 7F is a plan view taken along section line 7F—7F of FIG. 7B.
Figure 7G:
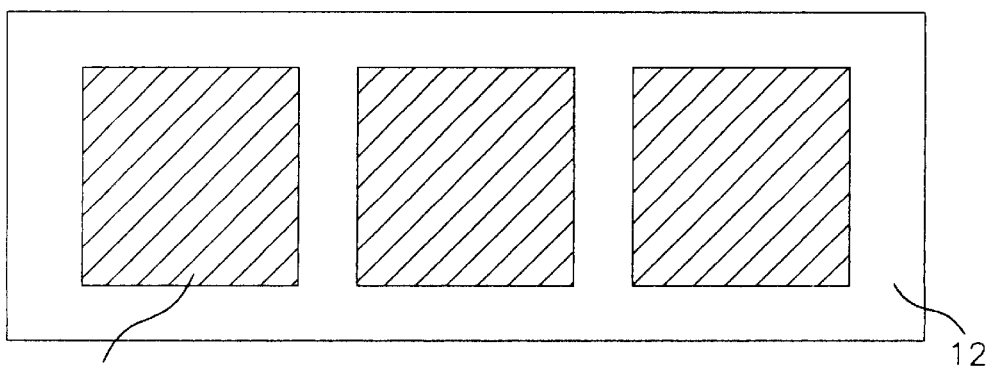
FIG. 7G is a plan view taken along section line 7G—7G of FIG. 7C.

Next, as shown in FIG. 7E, the mask 44 can be removed using a suitable stripper. In addition, the polymer material 40 within the recesses 20A can be removed using a suitable stripper. One suitable stripper for the previously identified thick film resist comprises hot NMP. As also shown in FIG. 7E, terminal contacts 36D can be attached to the pads 35D, substantially as previously described.

Figure 7H:
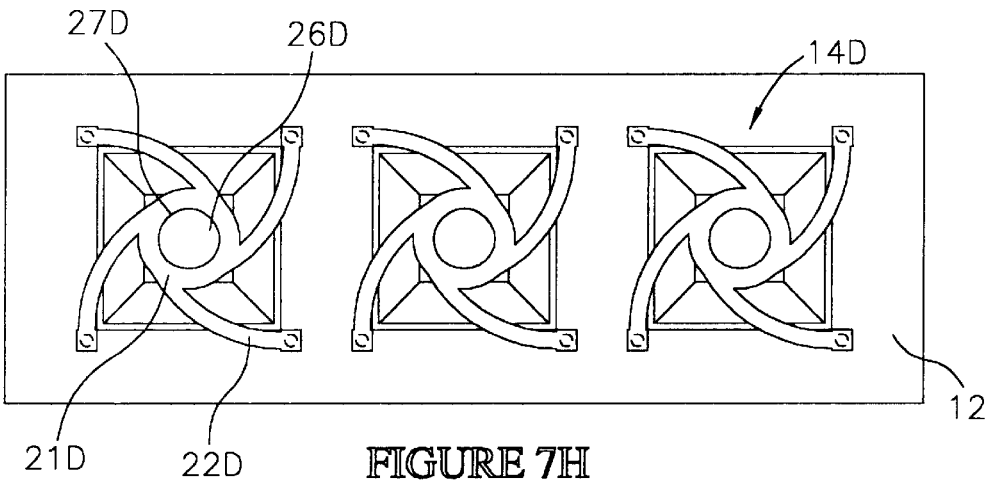
FIG. 7H is a plan view taken along section line 7H—7H of FIG. 7E.

As shown in FIG. 7H, the metal layers 42 (FIG. 7C) have been etched to form support members 21D and cantilevered leads 22D in electrical communication with the conductive vias 32D. If desired, the leads 22D can have a serpentine or scalloped configuration as previously described. In addition, other required features such as the openings 26D (or the blades 37—FIG. 4B) can be formed during the etching process. Some features, such as the blades 37 (FIG. 4B) may require additional masks and etch steps.

Optionally, the support members 21D can include a surface that will not bond to the bumped contacts 16. This can be a separate deposition process in which a separate metal or conductive polymer layer is applied, or the metal layers 42 can comprise a non bonding metal. Suitable non bonding metals for bumped contacts 16 formed of solder include Ti, $TiSi_2$ or Al. Suitable non bonding conductive polymers include carbon films and metal filled silicone.

Figure 8A:
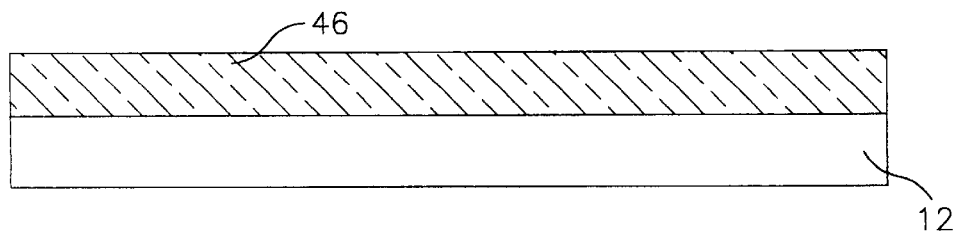
FIGS. 8A–8F are schematic cross sectional views illustrating steps in a method for fabricating the contact of FIGS. 5A–5B.

Referring to FIGS. 8A–8I, steps in a method for fabricating the interconnect 10 (FIG. 1) with the contact 14B (FIG. 5A) are illustrated. Initially, as shown in FIG. 8A, the substrate 12 can be provided. As before the substrate 12 can comprise silicon, ceramic, or plastic.

As also shown in FIG. 8A, a polymer layer 46 can be blanket deposited on the substrate 12. The polymer layer 46 can comprise the previously identified thick film resist sold by Shell Chemical under the trademark "EPON RESIN SU-8". This resist can be deposited in layers to a thickness of from about 3–50 mils. The resist also includes an organic solvent (e.g., gamma-butyloracton), and a photoinitiator.

A conventional resist coating apparatus, such as a spin coater, or a meniscus coater can be used to deposit the resist in viscous form onto the first surface of the substrate 12. The deposited resist can then be partially hardened by heating to about 95° C. for about 15 minutes or longer.

Figure 8B:
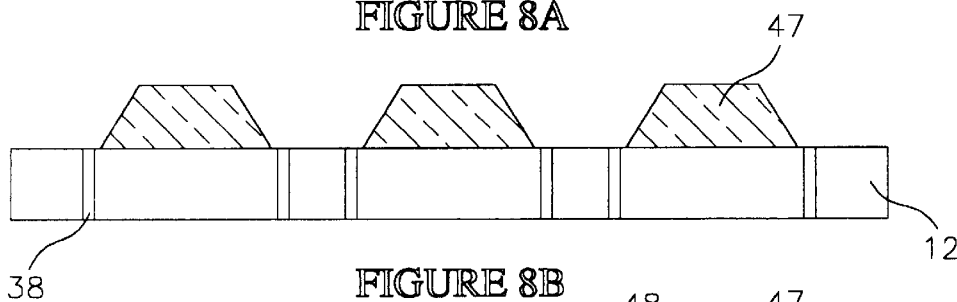

Next, as shown in FIG. 8B, the polymer layer 46 can be exposed and developed such that polymer bumps 47 are formed. As also shown in FIG. 8B, the openings 38 for conductive vias 32B can be formed in the substrate 12 as previously described.

Figure 8C:
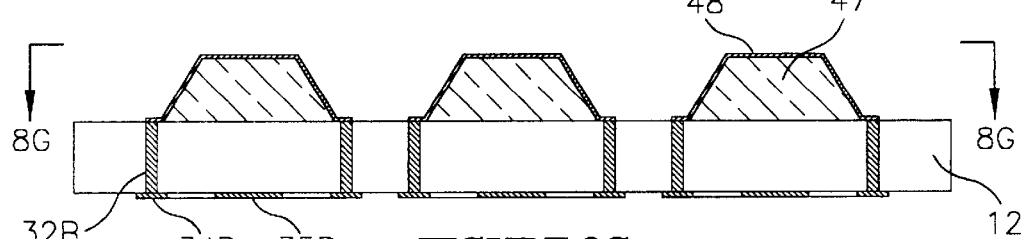
Figure 8D:
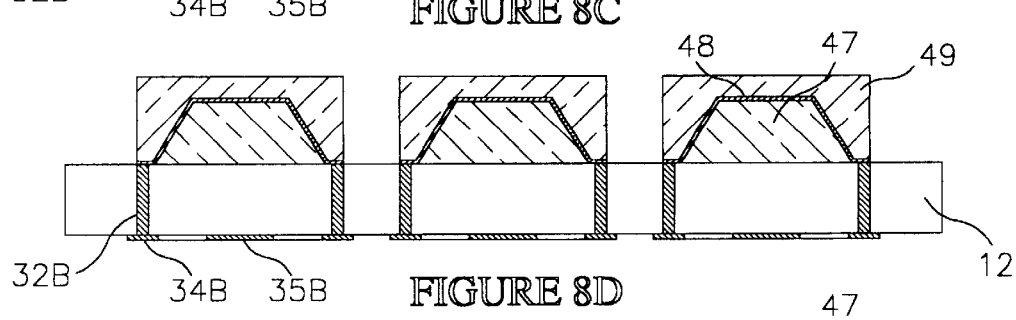
Figure 8E:
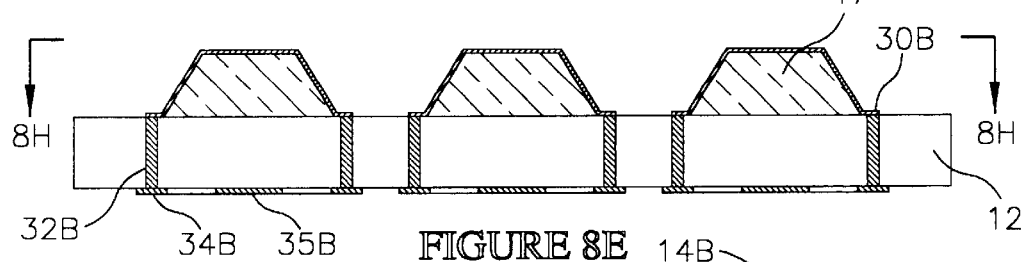
Figure 8F:
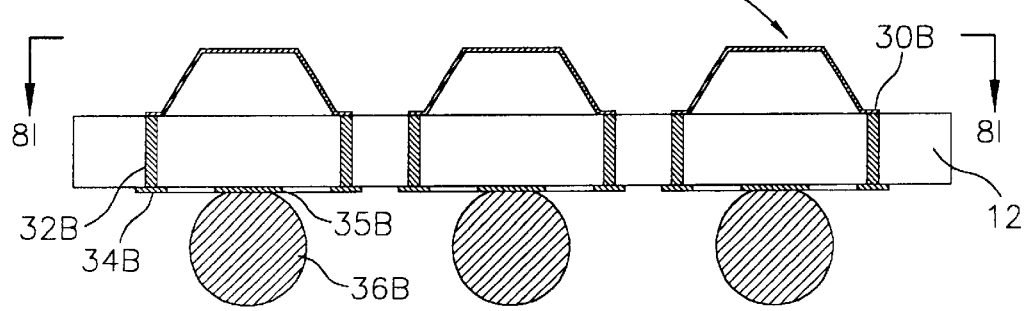
Figure 8G:
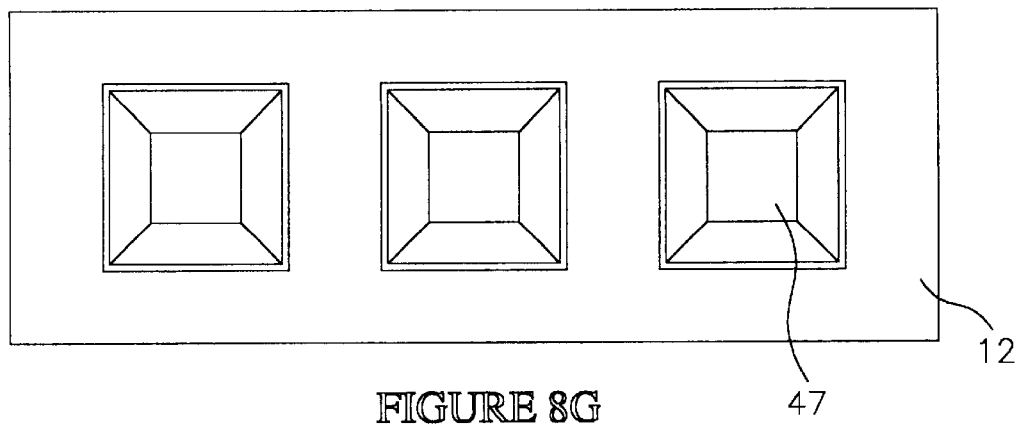
FIG. 8G is a plan view taken along section line 8G—8G of FIG. 8C.
Figure 8H:
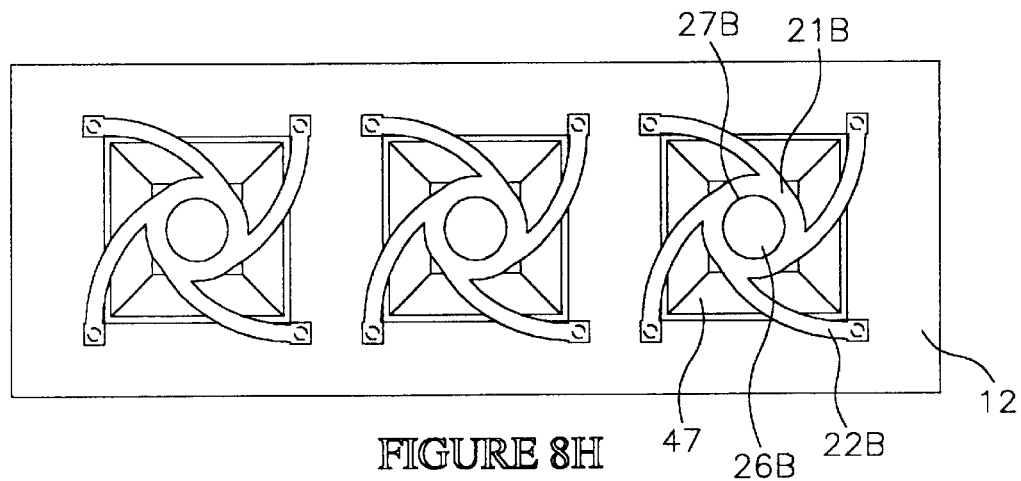
FIG. 8H is a plan view taken along section line 8H—8H of FIG. 8E.
Figure 8I:
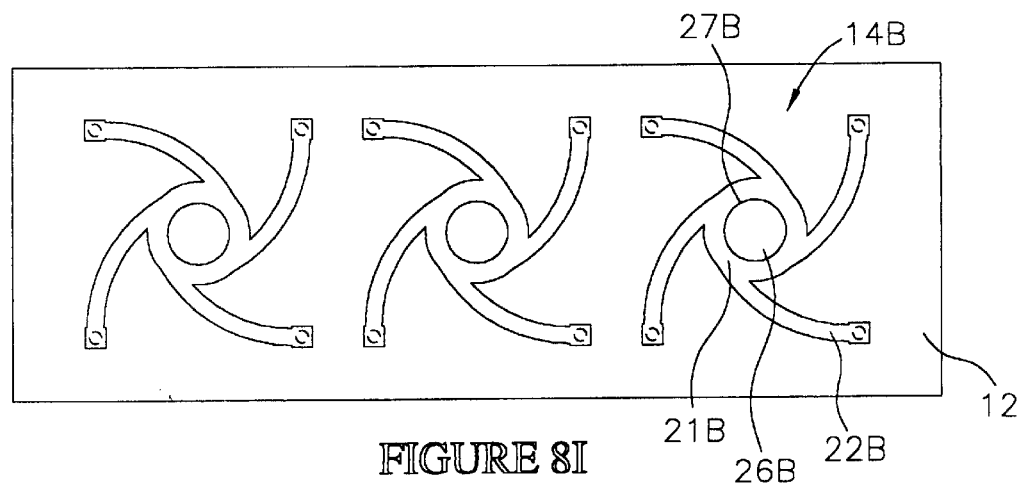
FIG. 8I is a plan view taken along section line 8I—8I of FIG. 8F.

The polymer bumps 47 are sized and shaped to form the support members 21B (FIG. 8I) and leads 22B (FIG. 8I) for the contacts 14B (FIG. 8I). A representative height for the polymer bumps 47 can be about 10–25 mils, and a representative width can be about 5–50 mils. For illustrative purposes, the leads 22B for the contacts 14B are shown in a bowed configuration when viewed from the side (e.g., FIG. 5B). However, it is to be understood that the leads 22B can have other configurations, such as a substantially straight when viewed from the side.

Exposure of the polymer layer 46 to form the polymer bumps 47 can be with a conventional UV mask writer using a suitable UV dose. A representative UV dose for the previously described resist formulation is about 165 mJ/cm$^2$. One suitable developer for the resist comprises a solution of PGMEA (propyleneglycol-monomethylether-acetate). Following development the resist can be fully hardened. A "full cure" can be performed with a hard bake at about 200° C. for about 30 minutes. Rather than a thick film resist, the polymer layer 46 can comprise another suitable curable polymer such as polyimide, or photoimageable polyimide.

Next, as shown in FIG. 8C, the conductive vias 32B, conductors 34B, and pads 35B can be formed as previously described. In addition, metal layers 48 are formed on the polymer bumps 47 and on the conductive vias 32B. The metal layers 48 can be deposited using a suitable deposition process such as such as CVD or electrodeposition. Preferably the metal layers 48 comprise a high yield strength metal, such as tungsten, titanium, nickel, platinum, iridium, or vanadium. A representative thickness of the metal layers 48 can be from 1 $\mu$m to 100 $\mu$m or more.

Next, as shown in FIG. 8D, resist masks 49 are formed on the metal layers 48. The resist masks 49 have a thickness that is greater than a height of the polymer bumps 47. The resist masks 49 can comprise the previously identified thick film resist used to form the polymer bumps 47. In addition, the resist masks 49 are developed with a required pattern for forming the conductors 30B (FIG. 8E), the support members 21B (FIG. 8I), and the leads 22B (FIG. 8I) for the contacts 14B. Using the resist masks 49, the metal layers 48 are etched to form the conductors 30B, the support members 21B and the leads 22B. Depending on the metal, a suitable wet etchant can be used to etch the metal layers 48 through openings in the resist masks 49.

Next, as shown in FIG. 8E, the resist masks 49 can be stripped using a suitable stripper. One suitable stripper for the previously identified thick film resist comprises hot NMP. Following stripping of the resist masks 49 and as shown in FIG. 8F, the polymer bumps 47 can also be stripped using a suitable stripper. Depending on the material used to form the polymer bumps 47 and resist masks 49 the same stripper can be used and the stripping step can be continuous. As another alternative a plasma etch process can be used to remove the resist masks 49 and polymer bumps 47. As also shown in FIG. 8F, the terminal contacts 36B can be attached to the pads 35B as previously described.

Die Level Test System

Referring to FIGS. 9A–9C, a test carrier 80 constructed using an interconnect 10A constructed in accordance with the invention is illustrated. The test carrier 80 is adapted to temporarily package semiconductor components 18A for test and burn-in. The semiconductor components 18A can comprise either bare dice, or chip scale packages. The semiconductor components 18A include bumped contacts 16, such as solder balls, in electrical communication with the integrated circuits contained on the components 18A.

The test carrier 80 includes the interconnect 10A, and a force applying mechanism 82. The interconnect 10A includes contacts 14D adapted to make temporary electrical connections with the bumped contacts 16 on the components 18A. The contacts 14 can be formed as previously described for contacts 14A (FIGS. 2A), or contacts 14B (FIG. 5A), or contacts 14C (FIG. 4A), or contacts 14D (FIG. 4C). In addition, the interconnect 10A includes conductive vias 32 in electrical communication with the contacts 14. The conductive vias 32 can be formed as previously described for conductive vias 32A (FIG. 2D).

The interconnect 10A also include terminal contacts 36 such as metal balls as previously described. Alternately other types of terminal contacts such as pins, flat pads, or shaped wires can be employed. The terminal contacts 36 are adapted to electrically engage mating electrical connectors (not shown) on a test apparatus 96 (FIG. 9A), such as a burn-in board. The test apparatus 96 includes, or is in electrical communication with test circuitry 98, adapted to apply test signals to the integrated circuits contained on the components 18A, and to analyze the resultant signals. The test carrier 80, test apparatus 96, and test circuitry 98 form a test system 100 (FIG. 9A).

The test carrier 80 also includes an alignment member 86 adapted to align the bumped contacts 16 on the components 18A, to the contacts 14 on the interconnect 10A. The alignment member 86 includes openings 88 configured to contact the peripheral edges of the components 18A to guide the components 18A onto the contacts 14. The alignment member 86 can be constructed, as described in U.S. Pat. No. 5,559,444, entitled "METHOD AND APPARATUS FOR TESTING UNPACKAGED SEMICONDUCTOR DICE", incorporated herein by reference. As another alternative, the alignment member 86 can be eliminated and the components 18A can be aligned with the contacts 14 using an optical alignment technique. Such an optical alignment technique is described in U.S. Pat. No. 5,796,264, entitled "APPARATUS FOR MANUFACTURING KNOWN GOOD SEMICONDUCTOR DICE", which is incorporated herein by reference.

As shown in FIGS. 9A and 9B, the force applying mechanism 82 includes a clamp member 90 which attaches to the interconnect 10A, and a plurality of biasing members 92 for pressing the components 18A against the contacts 14. In the illustrative embodiment, the biasing members 92 comprise elastomeric blocks formed of a polymer material such as silicone, butyl rubber, flourosilicone, or polyimide. Alternately the biasing members 92 can comprise steel leaf springs. The clamp member 90 includes tabs 94 for engaging the interconnect 10A to secure the clamp member 90 to the interconnect 10A.

In the illustrative embodiment, the clamp member 90 attaches directly to the interconnect 10A which is configured to form a base for the test carrier 80. However, the test carrier 80 can include a separate base, and the interconnect 10A can be mounted to the base as is described in U.S. Pat. No. 5,519,332 to Wood et al.; U.S. Pat. No. 5,541,525 to Wood et al.; U.S. Pat. No. 5,815,000 to Farnworth et al.; and U.S. Pat. No. 5,783,461 to Hembree, all of which are incorporated herein by reference.

Wafer Level Test System

Figure 10:
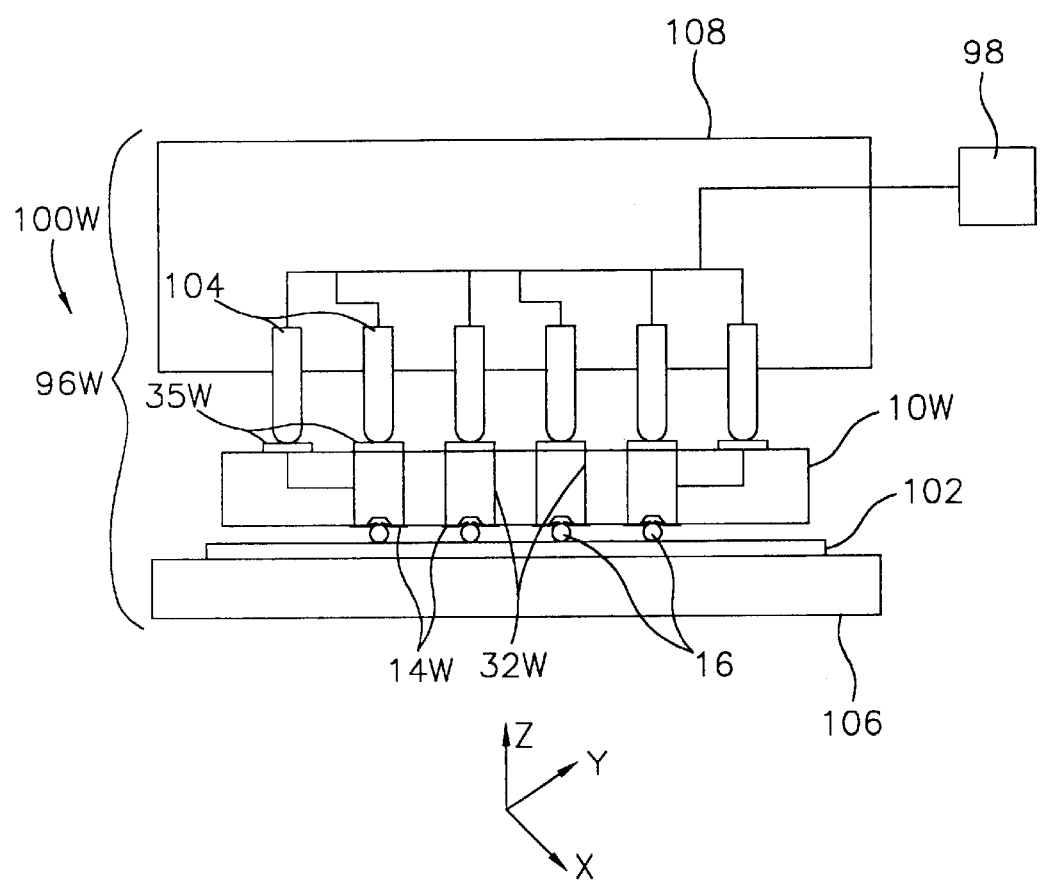
FIG. 10 is a schematic cross sectional view of a wafer level test system incorporating an interconnect constructed in accordance with the invention.

Referring to FIG. 10, a wafer level system 100W suitable for testing a semiconductor wafer 102 having bumped contacts 16 is illustrated. The wafer level test system 100W includes an interconnect 10W constructed in accordance with the invention as previously described, and mounted to a testing apparatus 96W.

The testing apparatus 96W includes, or is in electrical communication with test circuitry 98. The testing apparatus 96W can be a conventional wafer probe handler, or probe tester, modified for use with the interconnect 10W. Wafer probe handlers and associated test equipment are commercially available from Electroglass, Advantest, Teradyne, Megatest, Hewlett-Packard and others. In this system 100W, the interconnect 10W takes the place of a conventional probe card.

The interconnect 10W includes contacts 14W configured to establish electrical communication with the bumped contacts 16 on the wafer 102. The contacts 14W can be formed as previously described for contacts 14A (FIGS. 2A), or contacts 14B (FIG. 5A), or contacts 14C (FIG. 4A), or contacts 14D (FIG. 4C). In addition, the interconnect 10A includes conductive vias 32W in electrical communication with the contacts 14W. The conductive vias 32 can be formed as previously described for conductive vias 32A (FIG. 2D).

The testing apparatus 96W also includes a wafer chuck 106 configured to support and move the wafer 102 in x, y and z directions as required. In particular, the wafer chuck 106 can be used to step the wafer 102 so that the dice on the wafer 102 can be tested in groups until all of the dice have been tested. Alternately, the interconnect 10W can be configured to contact all of the bumped contacts 16 for all of the dice on the wafer 102 at the same time. Test signals can then be selectively applied and electronically switched as required, to selected dice on the wafer 102.

As also shown in FIGS. 10, the interconnect 10W can mount to a probe card fixture 108 of the testing apparatus 96W. The probe card fixture 108 can be similar in construction to a conventional probe card fixture commercially available from manufacturers such as Packard Hughes Interconnect and Wentworth Laboratories. The probe card fixture 108 can be formed of an electrically insulating material such as FR-4 or ceramic. In addition, the testing apparatus 96W can include a force applying mechanism in the form of multiple spring loaded electrical connectors 104 associated with the probe card fixture 108. The spring loaded electrical connectors 104 are in electrical communication with the testing circuitry 98.

The spring loaded electrical connectors 104 can be formed in a variety of configurations. One suitable configuration is known as a "POGO PIN" connector. This type of electrical connector includes a spring loaded pin adapted to contact and press against a flat surface to form an electrical connection. Pogo pin connectors are manufactured by Pogo Instruments, Inc., Kansas City, Kans. The spring loaded electrical connectors 104 can also comprise wires, pins or cables formed as spring segments or other resilient members.

In this embodiment the spring loaded electrical connectors 104 electrically contact pads 35W formed on the interconnect 10W. This arrangement provides separate electrical paths from the testing circuitry 98, through the spring loaded electrical connectors 104, through the pads 35W, through the conductive vias 32W and through the contacts 14W to the bumped contacts 16. During a test procedure, test signals can be applied to the integrated circuits on the wafer 102 using these separate electrical paths.

In addition to establishing electrical communication with the interconnect 10W, the spring loaded electrical connectors 104 also provide a mechanical force necessary for biasing the interconnect 10W against the wafer 102. Further details of a wafer level system similar to the system 100W are contained in U.S. patent application Ser. No. 08/797,719, filed Feb. 10, 1997, entitled "PROBE CARD FOR SEMICONDUCTOR WAFERS AND METHOD AND SYSTEM FOR TESTING WAFERS" which is incorporated herein by reference.

Thus the invention provides an improved test interconnect for testing semiconductor components having bumped contacts. The interconnect include contacts designed to provide a reliable electrical connection to the bumped contacts with a minimal application of contact force. In addition, the contacts are constructed to move in the z-direction to accommodate variations in the size or planarity of the bumped contacts and to twist relative to the bumped contacts to penetrate oxide layers thereon.

While the invention has been described with reference to certain preferred embodiments, as will be apparent to those skilled in the art, certain changes and modifications can be made without departing from the scope of the invention as defined by the following claims.

What is claimed is:

1. A method for fabricating an interconnect for testing a semiconductor component having a bumped contact comprising:

providing a substrate;

forming a recess in the substrate;

filling the recess with a polymer material;

forming a metal layer on the substrate and on the polymer material;

etching the metal layer to form a support member on the polymer material configured to electrically engage the bumped contact and a plurality of leads on the substrate and the polymer material attached to the support member; and removing the polymer material from the recess to cantilever the leads and suspend the support member on the recess.

2. A method for fabricating an interconnect for testing a semiconductor component having a bumped contact comprising:

providing a substrate;

forming a polymer bump on the substrate;

forming a metal layer on the polymer bump and on the substrate;

forming a support member in the metal layer configured to electrically engage the bumped contact and a plurality of leads in the metal layer attached to the support member and to the substrate; and removing at least a portion of the polymer bump from the substrate to cantilever the leads and suspend the support member on the substrate.

3. The method of claim 2 wherein the forming the support member step comprises etching.

4. The method of claim 2 further comprising during the forming the support member step forming a projection in the metal layer configured to penetrate the bumped contact.

5. The method of claim 2 further comprising during the forming the support member step forming the leads in a spiral configuration configured to twist the support member.

6. The method of claim 2 further comprising during the removing the support member step forming the leads in an extensible configuration.

7. The method of claim 2 further comprising forming a non-bonding outer layer on the support member prior to the removing step.

8. A method for fabricating an interconnect for testing a semiconductor component having a bumped contact comprising:

providing a substrate;

forming a polymer material on the substrate;

forming a metal layer on the substrate and the polymer material;

forming a support member on the polymer material configured to electrically engage the bumped contact, and a plurality of spring segment leads on the polymer material and the substrate attached to the support member; and removing at least a portion of the polymer material from the substrate to cantilever at least a portion of the spring segment leads and suspend the support member on the substrate.

9. The method of claim 8 wherein the substrate includes a recess, the forming the polymer material step substantially fills the recess, and the removing step suspends the support member on the recess.

10. The method of claim 8 wherein the polymer material comprises a bump and the removing step removes the bump from the substrate.

11. The method of claim 8 wherein the forming the support member step comprises etching.

12. The method of claim 8 further comprising forming a non-bonding outer layer on the metal layer prior to the forming the support member step.

13. The method of claim 11 wherein the non-bonding outer layer comprises a material selected from the group consisting of Ti, $TiSi_2$, Al and conductive polymers.

14. The method of claim 8 wherein the forming the support member step comprises forming the spring segment leads with a generally spiral configuration.

15. The method of claim 8 wherein the forming support member step comprises forming the spring segment leads with an extensible configuration.

16. The method of claim 8 wherein the metal layer comprise a metal selected from the group consisting of tungsten, titanium, nickel, platinum, iridium, and vanadium.

17. The method of claim 8 further comprising planarizing the polymer material prior to the forming the metal layer step.

18. The method of claim 8 wherein the polymer material comprises a material selected from the group consisting of resist and polyimide.

19. The method of claim 8 wherein the forming the polymer material step comprises depositing the polymer material in a viscous form and then curing the polymer material.

20. The method of claim 8 further comprising forming a plurality of conductive vias in the substrate in electrical communication with the spring segment leads.

* * * * *